(12) United States Patent
Han et al.

(10) Patent No.: US 12,100,356 B2
(45) Date of Patent: Sep. 24, 2024

(54) SHIFT REGISTER, GATE DRIVE CIRCUIT, DISPLAY PANEL, AND ELECTRONIC DEVICE

(71) Applicant: HONOR DEVICE CO., LTD., Shenzhen (CN)

(72) Inventors: Linhong Han, Shenzhen (CN); Wanming Wu, Shenzhen (CN); Di Geng, Shenzhen (CN); Ling Li, Shenzhen (CN); Zheng Tian, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 0 days.

(21) Appl. No.: 18/269,704

(22) PCT Filed: Jan. 4, 2023

(86) PCT No.: PCT/CN2023/070296
§ 371 (c)(1),
(2) Date: Jun. 26, 2023

(87) PCT Pub. No.: WO2023/207215
PCT Pub. Date: Nov. 2, 2023

(65) Prior Publication Data
US 2024/0242677 A1     Jul. 18, 2024

(30) Foreign Application Priority Data
Apr. 27, 2022 (CN) .......................... 202210449614.2

(51) Int. Cl.
G09G 3/3266    (2016.01)
G11C 19/28    (2006.01)

(52) U.S. Cl.
CPC .......... G09G 3/3266 (2013.01); G11C 19/28 (2013.01); G09G 2300/0819 (2013.01);
(Continued)

(58) Field of Classification Search
None
See application file for complete search history.

(56) References Cited

U.S. PATENT DOCUMENTS 10,453,546 B2    10/2019   Sun et al.
11,308,907 B2    4/2022   Zhang et al.
(Continued)

FOREIGN PATENT DOCUMENTS

CN    105304057 A    2/2016
CN    105810167 A    7/2016
(Continued)

*Primary Examiner* — Dorothy Harris
(74) *Attorney, Agent, or Firm* — WOMBLE BOND DICKINSON (US) LLP

(57) ABSTRACT

This application provides a shift register, a gate drive circuit, a display panel, and an electronic device. The shift register includes a node control module, electrically connected to a first level signal receiving end, a second level signal receiving end, a first node, and a second node; an input module, electrically connected to a first clock signal end, a trigger signal input end, and the second node; an output module, electrically connected to the first level signal receiving end, the second level signal receiving end, the first node, a third node, and a drive signal output end; a first voltage stabilizing module, electrically connected to the first node, a fourth node, and the second level signal receiving end; and a second voltage stabilizing module, electrically connected to the second node, the third node, the fourth node, and a second clock signal end.

19 Claims, 18 Drawing Sheets

(52) U.S. Cl.
CPC ............... *G09G 2300/0842* (2013.01); *G09G 2310/0286* (2013.01); *G09G 2330/021* (2013.01)

(56) References Cited

U.S. PATENT DOCUMENTS

| | | | |
|---|---|---|---|
| 11,380,243 B1 | 7/2022 | Lai et al. | |
| 2007/0274433 A1* | 11/2007 | Tobita | G11C 19/184 377/64 |
| 2009/0073105 A1* | 3/2009 | Chiang | G11C 19/28 345/100 |
| 2010/0245337 A1* | 9/2010 | Hu | G09G 3/3677 377/79 |
| 2012/0051494 A1* | 3/2012 | Yang | G11C 19/28 377/67 |
| 2012/0093276 A1* | 4/2012 | Wang | G09G 3/3677 377/78 |
| 2014/0064436 A1* | 3/2014 | Ma | G11C 19/28 377/64 |
| 2015/0131771 A1* | 5/2015 | Hu | G11C 19/28 377/68 |
| 2018/0047341 A1* | 2/2018 | Ma | G09G 3/36 |
| 2019/0340975 A1 | 11/2019 | Zhai | |
| 2020/0265877 A1 | 8/2020 | Zheng | |
| 2021/0020089 A1 | 1/2021 | Huang | |
| 2021/0118389 A1 | 4/2021 | Zhang et al. | |
| 2022/0343856 A1* | 10/2022 | Yu | H01L 27/1222 |

FOREIGN PATENT DOCUMENTS

| | | |
|---|---|---|
| CN | 107633833 A | 1/2018 |
| CN | 108492793 A | 9/2018 |
| CN | 110176204 A | 8/2019 |
| CN | 112259038 A | 1/2021 |
| CN | 112509513 A | 3/2021 |
| CN | 112634811 A | 4/2021 |

* cited by examiner

SHIFT REGISTER, GATE DRIVE CIRCUIT, DISPLAY PANEL, AND ELECTRONIC DEVICE

CROSS-REFERENCE TO RELATED APPLICATIONS

This application is a national stage of International Application No. PCT/CN2023/070296, filed on Jan. 4, 2023, which claims priority to Chinese Patent Application No. 202210449614.2, filed on Apr. 27, 2022. The disclosures of both of the aforementioned applications are hereby incorporated by reference in their entireties.

TECHNICAL FIELD

This application relates to the field of display technologies, and in particular, to a shift register, a gate drive circuit, a display panel, and an electronic device.

BACKGROUND

With the continuous development of display technologies, more and more electronic devices with display functions are widely used in people's daily life and work, bringing great convenience to people's daily life and work.

A main component for an electronic device to achieve a display function is a display panel. A drive signal is outputted by a gate drive circuit in the display panel, and the drive signal is transmitted to a pixel circuit in a pixel array by using a signal line such as a light-emitting control signal line or a scan line, which can control the pixel array to display an image. In related technologies, a drive circuit typically includes a plurality of cascaded shift registers. During transmission of an output signal as a drive signal to a signal line, an upper stage of shift registers also transmits the output signal as an input signal to a lower stage of shift registers, to control the lower stage of shift registers to output a drive signal.

However, the output signals of the existing shift registers are prone to instability, and deviations in the stability of the output signals often lead to circuit logic errors, ultimately leading to drive anomalies. Therefore, a circuit architecture having a simple structure and a high stability is needed.

SUMMARY

To solve the foregoing technical problem, this application provides a shift register, a gate drive circuit, a display panel, and an electronic device.

In a first aspect, an embodiment of this application provides a shift register. The shift register includes a node control module, electrically connected to a first level signal receiving end, a second level signal receiving end, a first node, and a second node; an input module, electrically connected to a first clock signal end, a trigger signal input end, and the second node; an output module, electrically connected to the first level signal receiving end, the second level signal receiving end, the first node, a third node, and a drive signal output end; a first voltage stabilizing module, electrically connected to the first node, a fourth node, and the second level signal receiving end; and a second voltage stabilizing module, electrically connected to the second node, the third node, the fourth node, and a second clock signal end, where the input module is configured to receive an input signal of the trigger signal input end and control a signal of the second node in response to a first clock signal received by the first clock signal end; the node control module is configured to receive a first level signal received by the first level signal receiving end and a second level signal received by the second level signal receiving end and control a signal of the first node in response to the signal of the second node; the output module is configured to receive the second level signal received by the second level signal receiving end and control, in response to the signal of the first node, a signal outputted by the drive signal output end; or, the output module is configured to receive the first level signal of the first level signal receiving end and control, in response to a signal of the third node, a signal outputted by the drive signal output end; the first voltage stabilizing module is configured to receive the second level signal received by the second level signal receiving end and control a signal of the fourth node in response to the signal of the first node; and the second voltage stabilizing module is configured to receive the signal of the second node and control the signal of the third node in response to a second clock signal received by the second clock signal end, where the first level signal is a low-level signal and the second level signal is a high-level signal; when a signal outputted by the drive signal output end is a low-level signal, a potential of a signal of the third node is lower than a potential of the first level signal received by the first level signal receiving end; or, the second voltage stabilizing module is configured to receive a signal of the fourth node and control the signal of the third node, so that a potential of a signal of the third node is opposite to a potential of a signal of the first node.

The potential of the third node may affect an output signal, and therefore the signal of the third node is controlled by the second voltage stabilizing module, so that when the signal outputted by the drive signal output end is at a low level, the potential of the signal of the third node is lower than the potential of the low level received by the first level signal receiving end, and further that the signal outputted by the drive signal output end is enabled to be at the low level received by the first level signal receiving end, thereby avoiding the situation, in which the first level signal received by the output module from the first level signal receiving end cannot be transmitted to the control drive signal output end due to a threshold loss of transistors in the output module, and which further affects output of the signal. In addition, when the signal of the first node is at a high level, control by the second voltage stabilizing module causes the signal of the third node to be at a low level. When the signal of the first node is at a low level, the potential of the first node controls the first voltage stabilizing module, so that the first voltage stabilizing module controls the second voltage stabilizing module to adjust the potential of the third node to be opposite to the potential of the first node, that is, the potentials of the first node and the third node are always opposite, so that the drive signal output end outputs the first level signal or the second level signal, and the first node and the third node do not have a same phase, resulting in that the drive signal output end has no signal output, that is, there is a dangling point. In other words, regardless of the time stage, coordination between the first node and the third node ensures that there is always a signal output at the drive signal output end, and there is no dangling point. In this way, the circuit instability due to influence of a load on the output signal of the drive signal output end OUT can be avoided.

In some possible implementations, the node control module includes: a first control unit, electrically connected to the first level signal receiving end, the first node, and the second node; and a second control unit, electrically connected to the second level signal receiving end, the first node, and the second node, where the first control unit is configured to receive the first level signal of the first level signal receiving end and control the signal of the first node in response to the signal of the second node; or, the second control unit is configured to receive the second level signal received by the second level signal receiving end and control the signal of the first node in response to the signal of the second node. That is, the first node is controlled separately by independent units. When the first node needs a first level signal, the first level signal is transmitted to the first node by the first control unit; and when the first node needs a second level signal, the second level signal is transmitted to the first node by the second control unit, thereby avoiding signal interference and enabling the signal of the first node to be more stable.

In some possible implementations, on the basis of that the node control module includes a first control unit, the first control unit includes at least one transistor having an active layer being an oxide semiconductor. For example, for a transistor having IGZO as an active layer, due to the advantage of a low leakage current of an IGZO transistor, when a low level is provided to the first node through the first control unit, the signal stability of the first node can be ensured, and further the signal outputted by the drive signal output end can be ensured to be relatively stable. When the signal outputted by the drive signal output end is a light-emitting control signal, since a light-emitting control transistor in a pixel circuit is turned on upon receipt of a low level, a display unit displays; and since the light-emitting control transistor in the pixel circuit is turned off upon receipt of a high level, the display unit does not display. In other words, when the light-emitting control signal outputted by the drive signal output end is at a high level, the light-emitting control transistor is turned off, and the display unit does not display; and when the signal outputted by the drive signal output end is at a low level, the light-emitting control transistor is turned on, and the display unit displays. In addition, due to the fact that the light-emitting control signal outputted by the drive signal output end is a high-level signal when the first control unit provides a low level to the first node, when the high-level signal outputted by the drive signal output end is stable, the light-emitting control transistor in the pixel circuit can be ensured to be completely turned off, thereby avoiding the occurrence of a bright screen.

In some possible implementations, the shift register further includes: a protection module, located between the second node and the third node, and between the second node and the second voltage stabilizing module, and electrically connected to the first level signal receiving end, where the protection module is configured to prevent the signal of the third node from being transmitted to the second node, thereby preventing the input module from being subjected to a high Vds bias.

In some possible implementations, the input module includes a first transistor; and a gate of the first transistor is electrically connected to the first clock signal end, a first pole of the first transistor is electrically connected to the trigger signal input end, and a second pole of the first transistor is electrically connected to the second node. Certainly, the specific structure of the input module is not limited herein, and can be disposed by a person skilled in the art according to an actual situation, as long as normal input of an input signal can be ensured. When the input module merely includes one transistor, the structure is simple.

In some possible implementations, on the basis of that the node control module includes a first control unit, the first control unit includes a second transistor; and a gate of the second transistor is electrically connected to the second node, a first pole of the second transistor is electrically connected to the first level signal receiving end, and a second pole of the second transistor is electrically connected to the first node. Certainly, the specific structure of the first control unit is not limited herein, and can be disposed by a person skilled in the art according to an actual situation. When the first control unit merely includes one transistor, the structure is simple.

In some possible implementations, on the basis of that the node control module includes a second control unit, the second control unit includes a third transistor; and a gate of the third transistor is electrically connected to the second node, a first pole of the third transistor is electrically connected to the second level signal receiving end, and a second pole of the third transistor is electrically connected to the first node. Certainly, the specific structure of the second control unit is not limited herein, and can be disposed by a person skilled in the art according to an actual situation, as long as normal input of an input signal can be ensured. When the second control unit merely includes one transistor, the structure is simple.

In some possible implementations, the first voltage stabilizing module includes a fourth transistor; and a gate of the fourth transistor is electrically connected to the first node, a first pole of the fourth transistor is electrically connected to the second level signal receiving end, and a second pole of the fourth transistor is electrically connected to the fourth node. Certainly, the specific structure of the first voltage stabilizing module is not limited herein, and can be disposed by a person skilled in the art according to an actual situation. When the first voltage stabilizing module merely includes one transistor, the structure is simple.

In some possible implementations, the second voltage stabilizing module includes a fifth transistor and a first capacitor; and a gate of the fifth transistor is electrically connected to the third node, a first pole of the fifth transistor is electrically connected to the second clock signal end, a second pole of the fifth transistor is electrically connected to a second pole of the first capacitor and the fourth node, and a first pole of the first capacitor is electrically connected to the second node and the third node, separately. The fifth transistor and the first capacitor form a capacitive coupling pull-down structure, so that when the signal outputted by the drive signal output end is at a low level, the potential of the signal of the third node is lower than the potential of the low level received by the first level signal receiving end, and further that the signal outputted by the drive signal output end is enabled to be at the low level received by the first level signal receiving end. When the signal of the first node is at a low level, the potential of the first node controls the first voltage stabilizing module, so that the first voltage stabilizing module writes a high-level signal to the fourth node. Due to a voltage stabilizing effect of the first capacitor, the potential of the third node (high level) is opposite to that of the first node N1 (low level), and in this way, the potentials of the third node and the first node can always be opposite, so that the drive signal output end outputs a first level signal or a second level signal and that the first node and the third node do not have a same phase, resulting in that the drive signal output end has no signal output, that is, there is a dangling point.

In some possible implementations, on the basis that the shift register further includes a protection module, the protection module includes a sixth transistor; and a gate of the sixth transistor is electrically connected to the first level signal receiving end, a first pole of the sixth transistor is electrically connected to the second node, and a second pole of the sixth transistor is electrically connected to the third node and the second voltage stabilizing module, separately.

In some possible implementations, the output module includes a second capacitor, a seventh transistor, and an eighth transistor; and both a gate of the seventh transistor and a first pole of the second capacitor are electrically connected to the first node, both a first pole of the seventh transistor and a second pole of the second capacitor are electrically connected to the second level signal receiving end, both a second pole of the seventh transistor and a second pole of the eighth transistor are electrically connected to the drive signal output end, a gate of the eighth transistor is electrically connected to the third node, and a first pole of the eighth transistor is electrically connected to the first level signal receiving end; the structure is simple and the stability of the signal outputted by the drive signal output end is ensured.

In some possible implementations, at least one of the input module, the first voltage stabilizing module, the second voltage stabilizing module, and the output module includes at least one transistor having an active layer being silicon. When integrated with an oxide semiconductor transistor and a low temperature polycrystalline silicon transistor, the shift register has characteristics such as a strong drive capability and a low power consumption.

In some possible implementations, when the node control module includes the transistor having an active layer being an oxide semiconductor, the transistor of the oxide semiconductor is an N-type transistor; and when at least one of the input module, the first voltage stabilizing module, the second voltage stabilizing module, and the output module includes a transistor having an active layer being silicon, the transistor having an active layer being silicon is P-type transistor. The combination of the N-type transistor and the P-type transistor can effectively reduce the number of thin film transistors required for a shift register ASG, thereby simplifying the structure of the shift register and facilitating implementation of a narrower border panel design.

In a second aspect, an embodiment of this application further provides a gate drive circuit, including N cascaded shift registers according to the first aspect, where N≥2.

The gate drive circuit has two functions, which can provide both a light-emitting control signal for controlling on or off of a light-emitting control transistor on a light-emitting branch and a control scan signal. That is, the gate drive circuit can serve as either a light-emitting control drive circuit or a scan drive circuit. When both the light-emitting control drive circuit and the scan drive circuit are the gate drive circuit, the light-emitting control drive circuit and the scan drive circuit have a same structure. By changing an input signal of a primary circuit, two different drive signals (a light-emitting control signal or a scan signal) for the pixel circuit can be generated without changing a clock signal. In addition, since the light-emitting control drive circuit and the scan drive circuit have the same structure, clock signals required thereby are also the same. Therefore, a clock signal line can be reused, and in this way, the number of clock signal lines can be reduced, thereby facilitating the narrow border design of the display panel, and the number of clock control modules in a display drive chip and providing clock signals for the clock signal lines can be reduced, thereby reducing the design cost of the display drive chip.

In a third aspect, an embodiment of this application further provides a display panel, including at least one gate drive circuit according to the second aspect, which has all the effects of the gate drive circuit in the second aspect.

In some possible implementations, at least two gate drive circuits are included, where one of the gate drive circuits is a light-emitting control drive circuit, and the other one of the gate drive circuits is a scan drive circuit; and a clock signal line electrically connected to the light-emitting control drive circuit is reused as a clock signal line of the scan drive circuit.

In a fourth aspect, an embodiment of this application further provides an electronic device, including the display panel according to the third aspect, which has all the effects of the gate drive circuit in the third aspect.

DESCRIPTION OF EMBODIMENTS

The technical solutions in embodiments of this application are clearly and completely described in the following with reference to the accompanying drawings in the embodiments of this application. Apparently, the described embodiments are some rather than all of the embodiments of this application. All other embodiments obtained by a person of ordinary skill in the art based on the embodiments of this application without making creative efforts shall fall within the protection scope of this application.

The term "and/or" used herein describes only an association relationship for describing associated objects and represents that three relationships may exist. For example, A and/or B may represent the following three cases: the following three cases: Only A exists, both A and B exist, and only B exists.

In the specification and claims in the embodiments of this application, the terms "first", "second", and the like are intended to distinguish between different objects but do not indicate a particular order of the objects. For example, a first target object and a second target object are intended to distinguish between different target objects, but do not indicate a particular order of the target objects.

In the embodiments of this application, the word such as "exemplary" or "for example" is configured to represent giving an example, an illustration, or a description. Any embodiment or design scheme described by using "exemplarily" or "for example" in the embodiments of this application should not be explained as being more preferred or having more advantages than another embodiment or design scheme. In particular, the word such as "exemplary" and "example" as used herein is intended to present the related concept in a specific implementation.

In the description of the embodiments of this application, unless otherwise stated, "a plurality of" means two or more. For example, a plurality of processing units refer to two or more processing units; and a plurality of systems refer to two or more systems.

Figure 1:
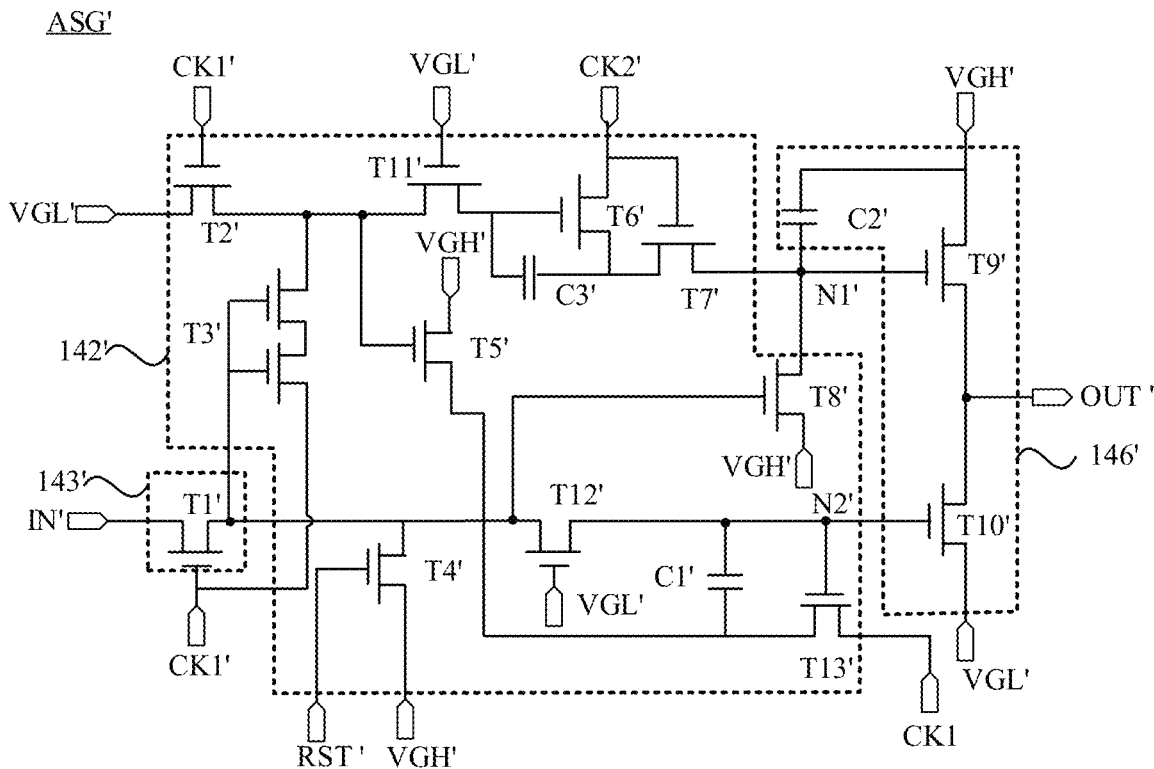
FIG. 1 is a schematic structural diagram of a shift register in the related technologies.

FIG. 1 is a schematic structural diagram of a shift register in the related technologies. As shown in FIG. 1, a shift register ASG' in related technologies includes an input module 143' composed of a transistor T1', a node control module 142' composed of transistors T2', T3', T4', T5', T6', T7', T8', T11', T12', and T13', and an output module 146' composed of transistors T9' and T10'. The node control module 142' is configured to control potentials of a first node N1' and a second node N2', to further control an output end OUT' of the output module 146' to output a low level or a high level.

However, it has been found through research by the applicant that there is a dangling point in the output signal by the output end OUT', that is, the first node N1' and the second node N2' are not always in an opposite phase within one frame, and at a particular time, both the first node N1' and the second node N2' are, for example, at a low level, so that both the transistors T9' and T10' are turned off, resulting in that the output signal is extremely prone to be affected by a load, which leads to instability of the circuit.

Figure 2:
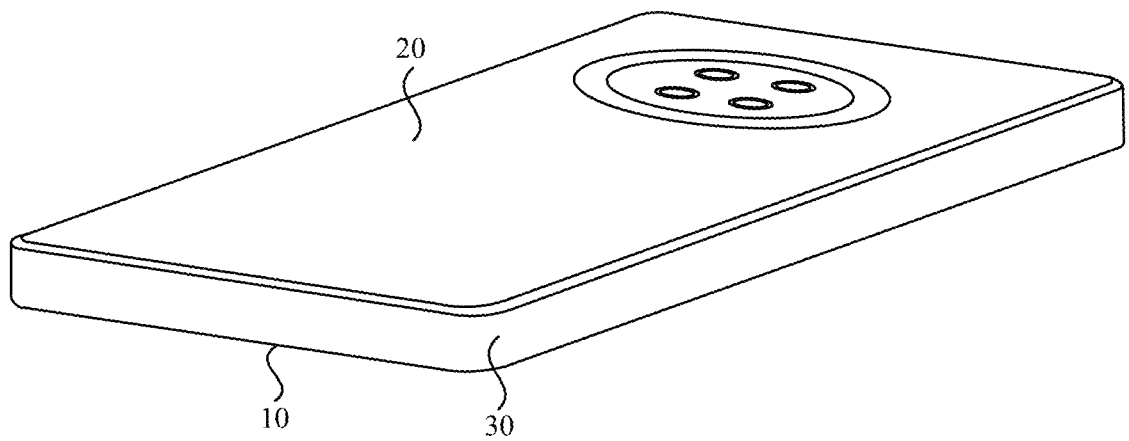
FIG. 2 is a schematic structural diagram of an electronic device according to an embodiment of this application.

An embodiment of this application provides an electronic device. The electronic device provided in this embodiment of this application may be an electronic device having a display panel such as a mobile phone, a tablet, a laptop, a personal digital assistant (personal digital assistant. PDA), vehicle-mounted computer, a smart wearable device, or a smart home device. A specific form of the electronic device is not specifically limited in this embodiment of this application. As shown in FIG. 2, for ease of description, an example in which the electronic device is a mobile phone is described.

As shown in FIG. 2, a mobile phone 100 includes a display panel 10, a rear housing 20, and a middle frame 30. The display panel 10, the rear housing 20, and the middle frame 30 may enclose an accommodating chamber. Structures such as a main board, a battery, and functional devices (not shown) are disposed in the accommodating chamber. The functional devices include, for example, a display drive chip and a processor. The processor sends a corresponding signal to the display drive chip, so that the display drive chip drives the display panel 10 for displaying.

A material of the rear housing 20 may include, for example, an opaque material such as plastic, plain leather, or glass fiber; or may include a transparent material such as glass. The material of the rear housing 20 is not limited in this embodiment of this application.

The display panel 10 includes, for example, a liquid crystal display (liquid crystal display. LCD) panel, an organic light emitting diode (organic light emitting diode. OLED) display panel, and an LED display panel. The LED display panel includes, for example, a Micro-LED display panel, a Mini-LED display panel or the like. A type of the display panel 10 is not limited in this embodiment of this application. The following is an example of using an OLED display panel as the display panel 10 for explanation.

Figure 3:
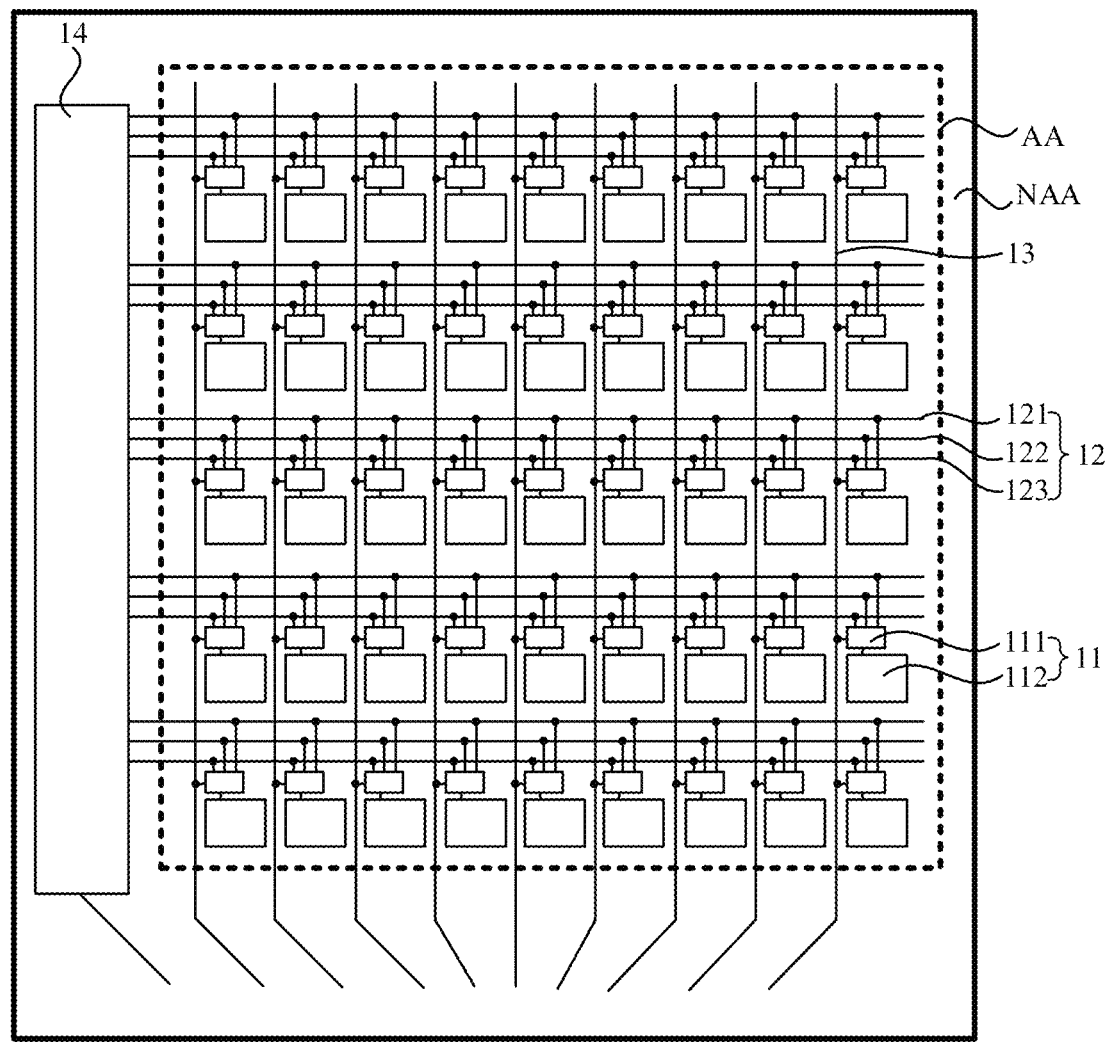
FIG. 3 is a schematic structural diagram of a display panel according to an embodiment of this application.

As shown in FIG. 3, the display panel 10 includes a display area AA and a non-display area NAA. The non-display area NAA is arranged, for example, surrounding around the display area AA. The display area AA of the display panel 10 is provided with a plurality of pixels 11 arranged in an array, a plurality of scan line groups 12, and a plurality of data lines 13. Each pixel 11 includes a pixel circuit 111 and a display unit 112. The plurality of data lines 13 are in one-to-one mapping to pixel circuits 111 in a plurality of columns of pixels 11, that is, pixel circuits 111 in one column of pixels 11 correspond to one data line 13. The plurality of scan line groups 12 are in one-to-one mapping to pixel circuits 111 in a plurality of rows of pixels 11, that is, pixel circuits 111 in one row of pixels 11 correspond to one scan line group 12.

Figure 4:
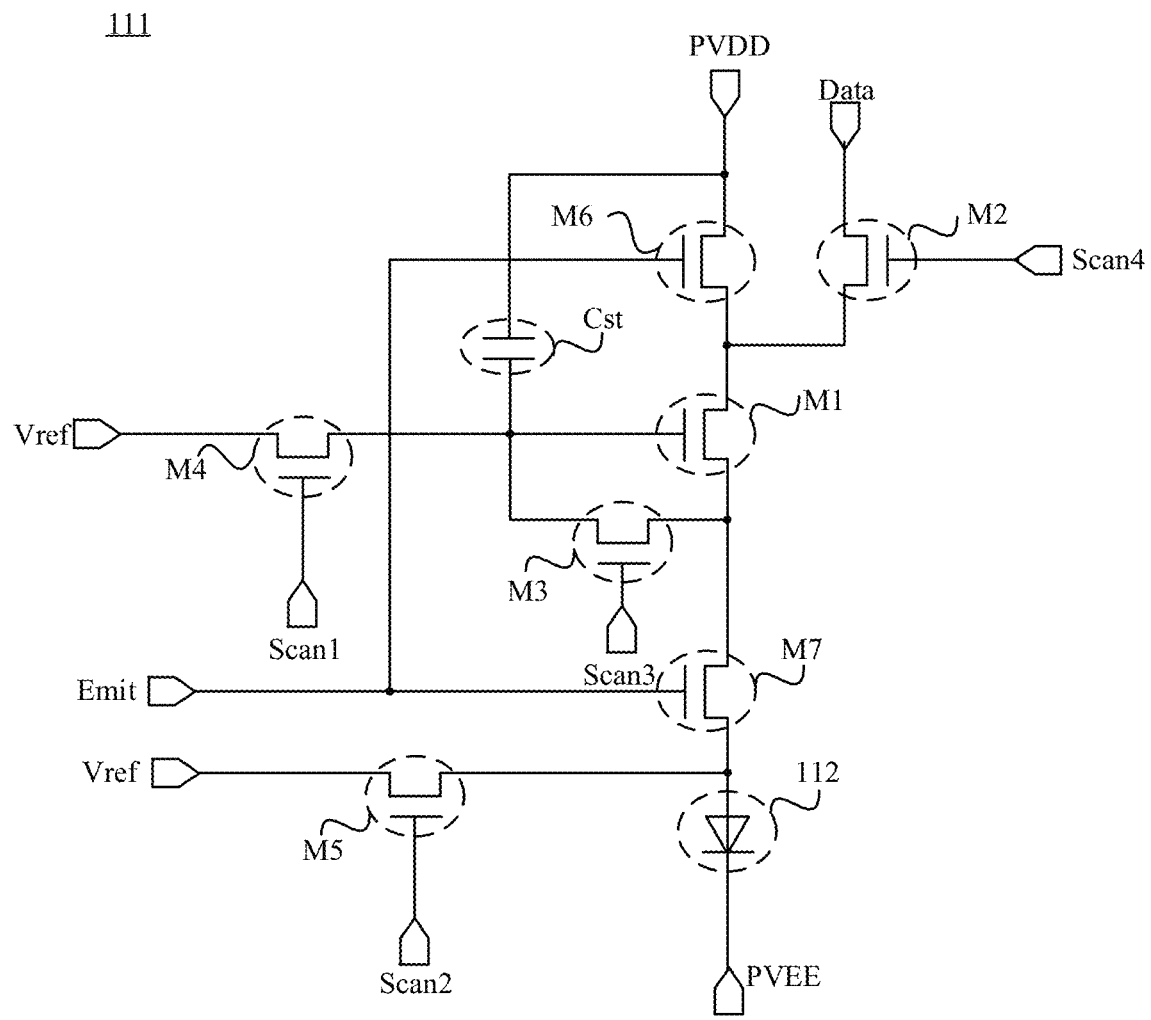
FIG. 4 is a schematic structural diagram of a pixel circuit according to an embodiment of this application.

In combination with FIG. 4, one pixel circuit 111 includes, for example, 7T1C (seven transistors and one storage capacitor), that is, the pixel circuit 111 may include a drive transistor M1, a data write transistor M2, a threshold compensation transistor M3, reset transistors M4 and M5, light-emitting control transistors M6 and M7, and a storage capacitor Cst.

It may be understood that a specific structure of pixel circuit 111 includes, but is not limited to, the foregoing examples. In other optional embodiments, the pixel circuit 111 can also be provided in other ways, as long as the display unit 112 can be driven to emit light.

The reset transistor M4 and the threshold compensation transistor M3 are transistors having active layers made of an oxide semiconductor materials, such as indium gallium zinc oxide (indium gallium zinc oxide. IGZO). The drive transistor M1, the data write transistor M2, the reset transistor M5, and the light-emitting control transistors M6 and M7 are made of silicon, which may be selected as a polycrystalline silicon, for example, transistors having an active layer made of a low temperature poly-silicon (low temperature poly-silicon. LTPS) material, that is. LTPS transistor and an IGZO transistor are integrated on one substrate, to form a low temperature polycrystalline oxide (low temperature polycrystalline oxide. LTPO) display panel 10.

A low temperature polycrystalline silicon transistor has the advantages of high carrier mobility; fast response, and low power consumption and an oxide semiconductor transistor have the advantage of a low leakage current. Therefore, when the pixel circuit 111 includes both a transistor having an active layer made of an LTPS material and a transistor having an active layer made of an IGZO material, the pixel circuit 111 can be guaranteed to have a good performance.

In addition, the pixel circuit 111 further includes an initialization signal end Vref, a first power supply end PVDD, a second power supply end PVEE, a data signal end Data, a first scan signal end Scan1, a second scan signal end Scan2, a third scan signal end Scan3, a fourth scan signal end Scan4, and a light-emitting control signal end Emit. A first pole of the light-emitting control transistor M6 is electrically connected to the first power supply end PVDD, a first pole of the data write transistor M2 is electrically connected to the data signal end Data, a gate of the data write transistor M2 is electrically connected to the fourth scan signal end Scan4, a gate of the threshold compensation transistor M3 is electrically connected to the third scan signal end Scan3, first poles of the reset transistors M4 and M5 are electrically connected to the initialization signal end Vref, separately (initialization signal ends to which the transistors M4 and M5 correspond may be the same or different), a gate of reset transistor M4 may be electrically connected to the first scan signal end Scan1, a gate of reset transistor M5 may be electrically connected to the second scan signal end Scan2, gates of the light-emitting control transistors M6 and M7 may be electrically connected to the light-emitting control signal end Emit, separately; the light-emitting control transistor M7 is electrically connected to an anode of the first light-emitting element 112, and a cathode of the first light-emitting element 112 is electrically connected to the second power supply end PVEE.

Correspondingly, continuously referring to FIG. 3, each scan line group 12 includes a first scan signal line 121, a second scan signal line 122, and a light-emitting control signal line 123.

Correspondingly, pixel circuit 111 in a column of pixels 11 corresponds to one data line 13, that is, data signal ends Data of pixel circuits 111 in a same column of pixels 11 are electrically connected to a same data line 13. Pixel circuits 111 in a row of pixels 11 correspond to one scan line group 12, that is, first scan signal ends Scan1 of pixel circuits 111 in a same row of pixels 11 are electrically connected to a first scan signal line 121 corresponding to that row, second scan signal ends Scan2 of pixel circuit 111 in a same row of pixels 11 are electrically connected to a second scan signal line 122 corresponding to that row, third scan signal ends Scan3 of pixel circuits 111 in a same row of pixels 11 are electrically connected to a first scan signal line 121 corresponding to another row (a specific row may be set by a person skilled in the art according to an actual situation), fourth scan signal ends Scan4 of pixel circuits 111 of a same row of pixels 11 are electrically connected to a second scan signal line 122 corresponding to another row (a specific row may be set by a person skilled in the art according to an actual situation), and light-emitting control signal ends Emit of pixel circuits 111 of a same row of pixels 11 are electrically connected to a same light-emitting control signal line 123.

It should be noted that in order to ensure the simplicity and clarity of the circuit. FIG. 3 does not show that third scan signal ends Scan3 of pixel circuits 111 in a same row of pixels 11 are electrically connected to a first scan signal line 121 corresponding to another row, and that fourth scan signal ends Scan4 of pixel circuits 111 in a same row of pixels 11 are electrically connected to the second scan signal line 122 corresponding to another row.

In other words, pixel circuits 111 using an LTPO technology usually need three types of gate control signals: first, a light-emitting control signal transmitted by the light-emitting control signal line 123, that is, the light-emitting control signal transmitted by the light-emitting control signal line 123 may control on or off of the light-emitting control transistors M6 and M7 on a light-emitting branch; second, a first scan signal transmitted by the first scan signal line 121, that is, the first scan signal transmitted by the first scan signal line 121 may control on or off of the reset transistor M4 and threshold compensation transistor M3 having IGZO as the active layer, in other words, the first scan signal transmitted by the first scan signal line corresponding to the row of the reset transistor M4 may control on or off of the reset transistor M4, and the first scan signal transmitted by the first scan signal line corresponding to another row controls on or off of the threshold compensation transistor M3; third, a second scan signal transmitted by the second scan signal line 122, that is, the second scan signal transmitted by the second scan signal line 122 may control on or off of the reset transistor M5 and data write transistor M2 having an LTPS as the active layer, in other words, the second scan signal transmitted by the second scan signal line corresponding to the row of the reset transistor M5 may control on or off of the reset transistor M5, and the second scan signal transmitted by the second scan signal line corresponding to another row controls on or off of the data write transistor M2.

The principles according to which the pixel circuits 111 drive the display unit 112 to emit light based on a light-emitting control signal, a first scan signal, a second scan signal, or the like are similar to the principles according to which the pixel circuits of the 7T1C in the prior art drive the display unit to emit light, and details are not described again herein.

Continuously referring to FIG. 3, the non-display area NAA of the display panel 10 is provided with a drive circuit 14. The drive circuit 14 may include, for example, a first scan drive circuit, a second scan drive circuit, and a light-emitting control drive circuit. The first scan drive circuit includes a plurality of first scan signal output ends, the second scan drive circuit includes a plurality of second scan signal output ends, and the light-emitting control drive circuit includes a plurality of light-emitting control signal output ends. The plurality of first scan signal output ends of the first scan drive circuit are electrically connected to the plurality of first scan signal lines 121 in the display area AA in a one-to-one manner, the plurality of second scan signal output ends of the second scan drive circuit are electrically connected to the plurality of second scan signal lines 122 in the display area AA in a one-to-one manner, and the plurality of light-emitting control signal output ends of the light-emitting control drive circuit are electrically connected to the plurality of light-emitting control signal lines 123 in the display area AA in a one-to-one manner. The first scan drive circuit transmits a first scan signal to the first scan signal lines 121 through the first scan signal output ends, the second scan drive circuit transmits a second scan signal to the second scan signal lines 122 through the second scan signal output ends, and the light-emitting control drive circuit transmits a light-emitting control signal to the light-emitting control signal lines 123 through the light-emitting control signal output ends.

Figure 5:
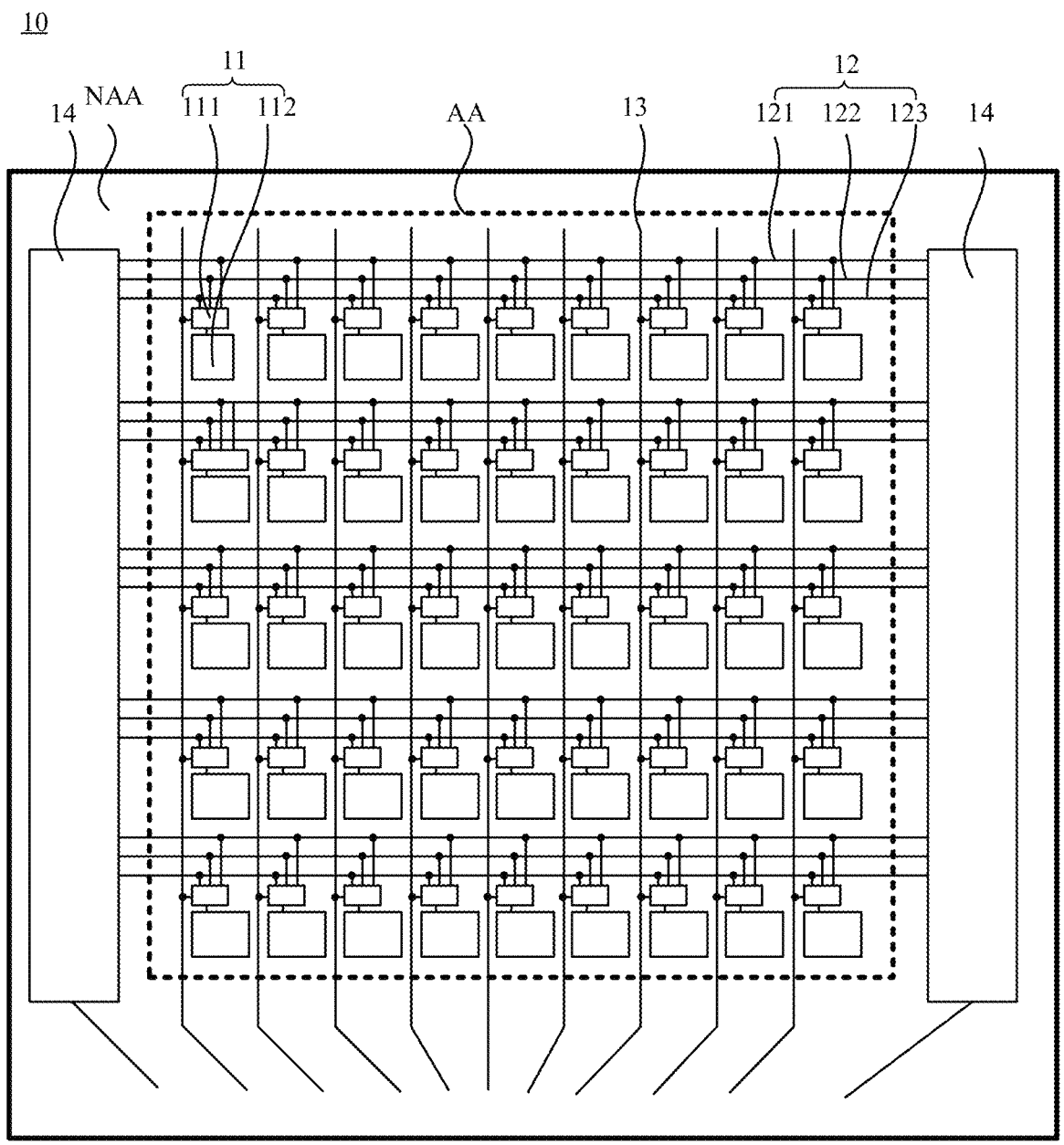
FIG. 5 is a schematic structural diagram of another display panel according to an embodiment of this application.

It should be noted that the drive circuit 14 may be located on the left side of the display area AA, as shown in FIG. 3. However, the position of the drive circuit 10 is not limited herein, and the position of the drive circuit 10 in the display panel can be set by a person skilled in the art according to an actual situation. For example, drive circuits 14 may also be disposed on two opposite sides of the display area AA, as shown in FIG. 5. When the drive circuits 14 are disposed on the two opposite sides of the display area AA, both the drive circuits 14 located on the two sides provide corresponding signals to the first scan signal line 121, the second scan signal line 122, and the light-emitting control signal line 123, thereby avoiding influence on the display effect of the display panel due to a voltage drop on the signal line. The following embodiments are explained by using an example in which a drive circuit 14 is located on the left side of the display area AA.

For the foregoing technical problem, this embodiment of this application provides a gate drive circuit, in which the first voltage stabilizing module is controlled by using the potential of the first node, so that the first voltage stabilizing module controls the second voltage stabilizing module to adjust the potential of the third node to be opposite to the potential of the first node, and in this way, the potentials of the third node and the first node can always be opposite, thereby avoiding circuit instability due to the fact that the output signal is extremely prone to be affected by a load in a case that there is a dangling point in the output signal when the potentials of the third node and the first node are not opposite at a particular time. In addition, the gate drive circuit has two functions, which can provide both a light-emitting control signal for controlling on or off of a light-emitting control transistors M6 and M7 on a light-emitting branch and first scan signal for controlling on or off of the reset transistor M4 and threshold compensation transistor M3. That is, the gate drive circuit can serve as either a light-emitting control drive circuit or a first scan drive circuit. When both the light-emitting control drive circuit and the first scan drive circuit are the gate drive circuit, the light-emitting control drive circuit and the first scan drive circuit have a same structure. By changing an input signal of a primary circuit, two different drive signals (a light-emitting control signal or a first scan signal) for the pixel circuit can be generated without changing a clock signal. In addition, since the light-emitting control drive circuit and the first scan drive circuit have the same structure, clock signals required thereby are also the same. Therefore, a clock signal line can be reused, and in this way, the number of clock signal lines can be reduced, thereby facilitating the narrow border design of the display panel, and the number of clock control modules in a display drive chip and providing clock signals for the clock signal lines can be reduced, thereby reducing the design cost of the display drive chip.

A specific structure of the gate drive circuit provided in this embodiment of this application is introduced below.

Figure 6:
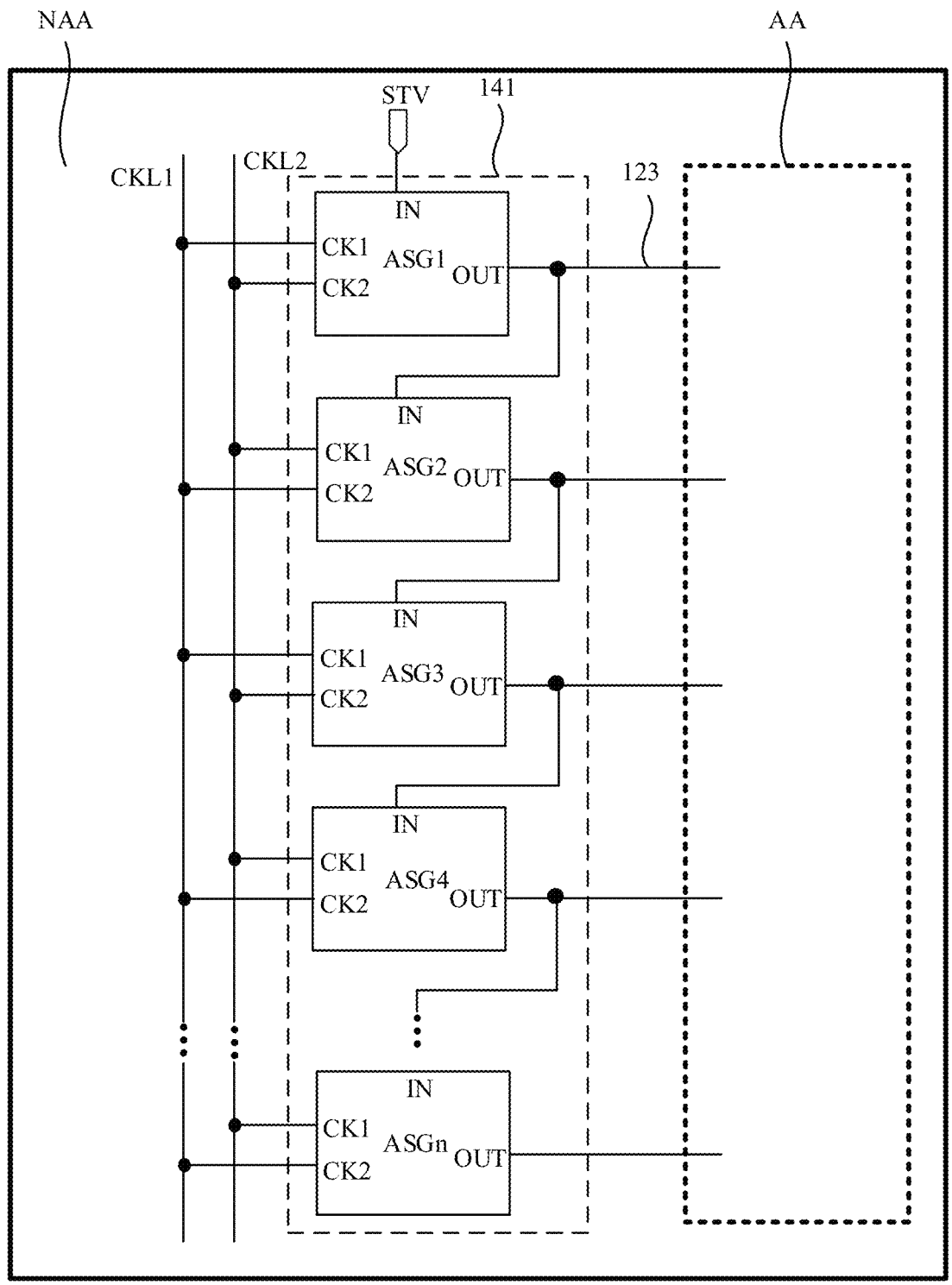
FIG. 6 is a schematic structural diagram of still another display panel according to an embodiment of this application.

As shown in FIG. 6, in this embodiment of this application, a gate drive circuit 141 includes N cascaded shift registers ASG, for example, including N shift registers ASG1 to ASGn, where N≥2. A specific value of N may be set by a person skilled in the art according to an actual situation, which is not limited herein.

Each stage of shift registers ASG includes a first clock signal end CK1, a second clock signal end CK2, a trigger signal input end IN, and a drive signal output end OUT. Apart from the last stage of shift registers ASGn, the drive signal output end OUT of each stage of shift registers ASG is electrically connected to the trigger signal input end IN of an adjacent lower stage of shift registers ASG, and the trigger signal input end IN of the first stage of shift registers ASG1 receives a trigger signal STV transmitted by the trigger signal line (not shown in FIG. 6). The shift register ASG sends, through the drive signal output end OUT, a light-emitting control signal to the light-emitting control signal line 123 or a first scan signal to the first scan signal line 121 based on the first clock signal inputted by the first clock signal end CK1, the second clock signal inputted by the second clock signal end CK2, and the trigger signal STV inputted by the trigger signal input end IN.

The display panel 10 further includes a first clock signal line CKL1 and a second clock signal line CKL2 located in the non-display area NAA. The first clock signal end CK1 of an odd stage of shift registers ASG is electrically connected to the first clock signal line CKL1, and the second clock signal end CK2 of the odd stage of shift registers ASG is electrically connected to the second clock signal line CKL2; the first clock signal end CK1 of an even stage of shift registers ASG is electrically connected to the second clock signal line CKL2, and the second clock signal end CK2 of the even stage of shift registers ASG is electrically connected to the first clock signal line CKL1. As shown in FIG. 6, first clock signal ends CK1 of the first stage of shift registers ASG1 and the third stage of shift registers ASG3 are electrically connected to the first clock signal line CKL1, second clock signal ends CK2 of the first stage of shift registers ASG1 and the third stage of shift registers ASG3 are electrically connected to the second clock signal line CKL2, and first clock signal end CK1 of the second stage of shift registers ASG2 and the fourth stage of shift registers ASG4 are electrically connected to the second clock signal line CKL2, and second clock signal ends CK2 of the second stage of shift registers ASG2 and the fourth stage of shift registers ASG4 are electrically connected to the first clock signal line CKL1.

Figure 7:
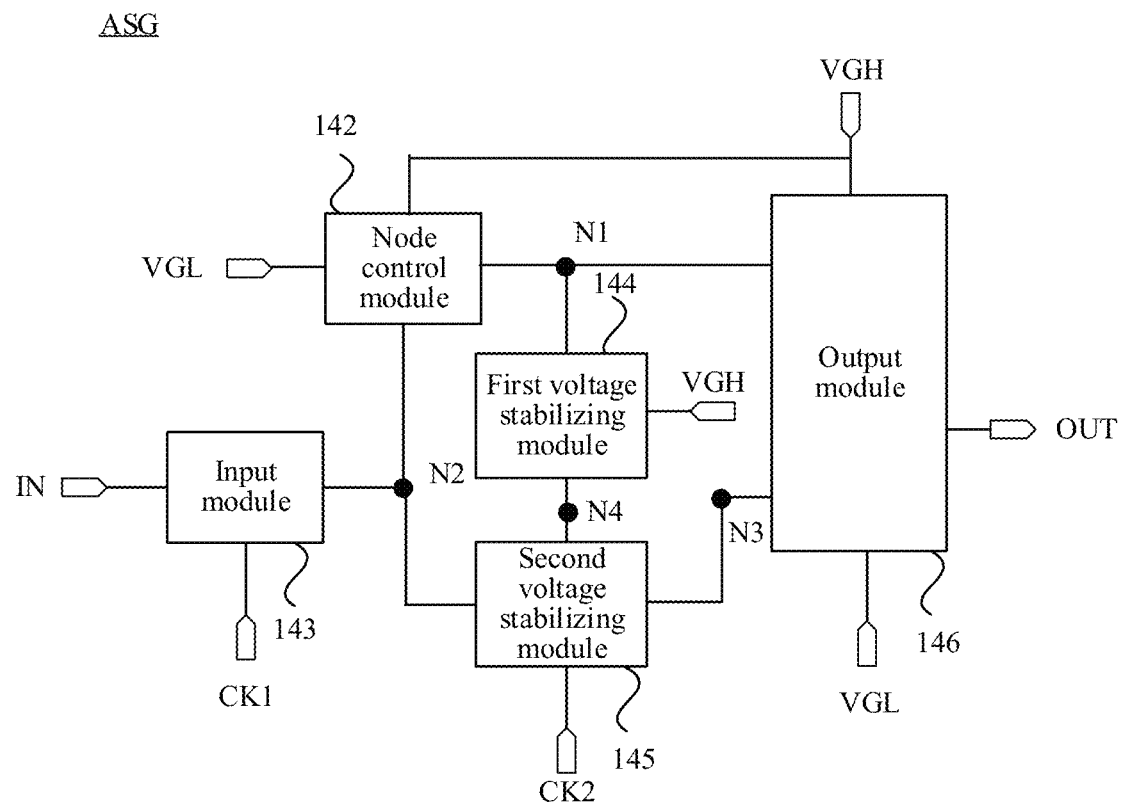
FIG. 7 is a schematic structural diagram of a shift register according to an embodiment of this application.

In combination with FIG. 7, each stage of shift register ASG further includes: a first level signal receiving end VGL, a second level signal receiving end VGH, a node control module 142, an input module 143, a first voltage stabilizing module 144, a second voltage stabilizing module 145, and an output module 146.

The node control module 142 is electrically connected to a first level signal receiving end VGL, a second level signal receiving end VGH, a first node N1, and a second node N2. The input module 143 is electrically connected to a first clock signal end CK1, a trigger signal input end IN, and the second node N2. The first voltage stabilizing module 144 is electrically connected to the first node N1, the second level signal receiving end VGH, and a fourth node N4. The second voltage stabilizing module 145 is electrically connected to the second node N2, a third node N3, the fourth node N4, and a second clock signal end CK2. The output module 146 is electrically connected to the first level signal receiving end VGL, the second level signal receiving end VGH, the first node N1, the third node N3, and a drive signal output end OUT.

The input module 143 is configured to receive an input signal STV of the trigger signal input end IN and control a signal of the second node N2 in response to a first clock signal CKV1 received by the first clock signal end CK1.

The node control module 142 is configured to receive a first level signal of the first level signal receiving end VGL and a second level signal received by the second level signal receiving end VGH and control a signal of the first node N1 in response to the signal of the second node N2.

The output module 146 is configured to receive the second level signal received by the second level signal receiving end VGH and control the drive signal output end OUT to output a light-emitting control signal or a first scan signal in response to the signal of the first node N1; or, the output module 146 is configured to receive the first level signal of the first level signal receiving end VGL and control the drive signal output end OUT to output a light-emitting control signal or a first scan signal in response to a signal of the third node N3.

The first voltage stabilizing module 144 is configured to receive the second level signal received by the second level signal receiving end VGH and control a signal of the fourth node N4 in response to the signal of the first node N1.

The second voltage stabilizing module 145 is configured to receive the signal of the second node N2 and control the signal of the third node N3 in response to a second clock signal CKV2 received by the second clock signal end CK2, where the first level signal is a low-level signal and the second level signal is a high-level signal; when a signal outputted by the drive signal output end OUT is a low-level signal, a potential of a signal of the third node N3 is lower than a potential of the first level signal received by the first level signal receiving end VGL; or, the second voltage stabilizing module 145 is configured to receive a signal of the fourth node N4 and control the signal of the third node N3, so that a potential of a signal of the third node N3 is opposite to a potential of a signal of the first node N1.

In this embodiment of this application, the input module 143 receives the input signal STV and controls the signal of the second node N2 in response to the first clock signal CKV1, the node control module 142 receives the first level signal and the second level signal and controls the signal of the first node N1 in response to the signal of the second node N2, and the output module 145 receives the second level signal and controls the output signal in response to the signal of the first node N1; or, the output module 145 receives the first level signal and controls the output signal in response to the signal of the third node N3. The potential of the third node N3 may affect an output signal, and therefore the signal of the third node N3 is controlled by the second voltage stabilizing module 145, so that when the signal outputted by the drive signal output end OUT is at a low level, the potential of the signal of the third node N3 is lower than the potential of the low level received by the first level signal receiving end VGL, and further that the signal outputted by the drive signal output end OUT is enabled to be at the low level received by the first level signal receiving end VGL, thereby avoiding the situation, in which the first level signal received by the output module 145 from the first level signal receiving end VGL cannot be transmitted to the control drive signal output end OUT due to a threshold loss of transistors in the output module 146, and which further affects output of the signal. In addition, when the signal of the first node N1 is at a high level, control by the second voltage stabilizing module 145 causes the signal of the third node N3 to be at a low level. When the signal of the first node N1 is at a low level, the potential of the first node N1 controls the first voltage stabilizing module 144, so that the first voltage stabilizing module 144 controls the second voltage stabilizing module 145 to adjust the potential of the third node N3 to be opposite to the potential of the first node N1, that is, the potentials of the first node N1 and the third node N3 are always opposite, so that the drive signal output end OUT outputs the first level signal or the second level signal, and the first node N1 and the third node N3 do not have a same phase, resulting in that the drive signal output end OUT has no signal output, that is, there is a dangling point. In other words, regardless of the time stage, coordination between the first node N1 and third node N3 ensures that there is always a signal output at the drive signal output end OUT, and there is no dangling point. In this way, the circuit instability due to influence of a load on the output signal of the drive signal output end OUT can be avoided.

Optionally, the node control module 142 includes at least one transistor. The transistor is a transistor having an oxide semiconductor material, such as IGZO, as an active layer. At least one of the input module 143, the first voltage stabilizing module 144, the second voltage stabilizing module 145, and the output module 146 includes at least one transistor, and the transistor is a transistor having an active layer made of silicon, optionally polycrystalline silicon, such as LTPS.

Since the node control module 142 includes an IGZO transistor, for which the current leakage of the first node N1 can be alleviated compared with a node control module with all transistors therein being LTPS transistors, the signal of the first node N1 is stable and further the output signal is stable. In addition, since the shift register ASG is integrated with an IGZO transistor and an LTPS transistor, the shift register ASG can have characteristics of a relatively strong drive capability and a low power consumption.

Optionally, the IGZO transistor included in the node control module 142 is an N-type IGZO transistor, and the LTPS transistor included in at least one of the first voltage stabilizing module 144, the second voltage stabilizing module 145, and the output module 146 is a P-type LTPS transistor. The combination of the N-type transistor and the P-type transistor can effectively reduce the number of thin film transistors required for a shift register ASG, thereby simplifying the structure of the shift register ASG and facilitating implementation of a narrower border panel design.

Figure 8:
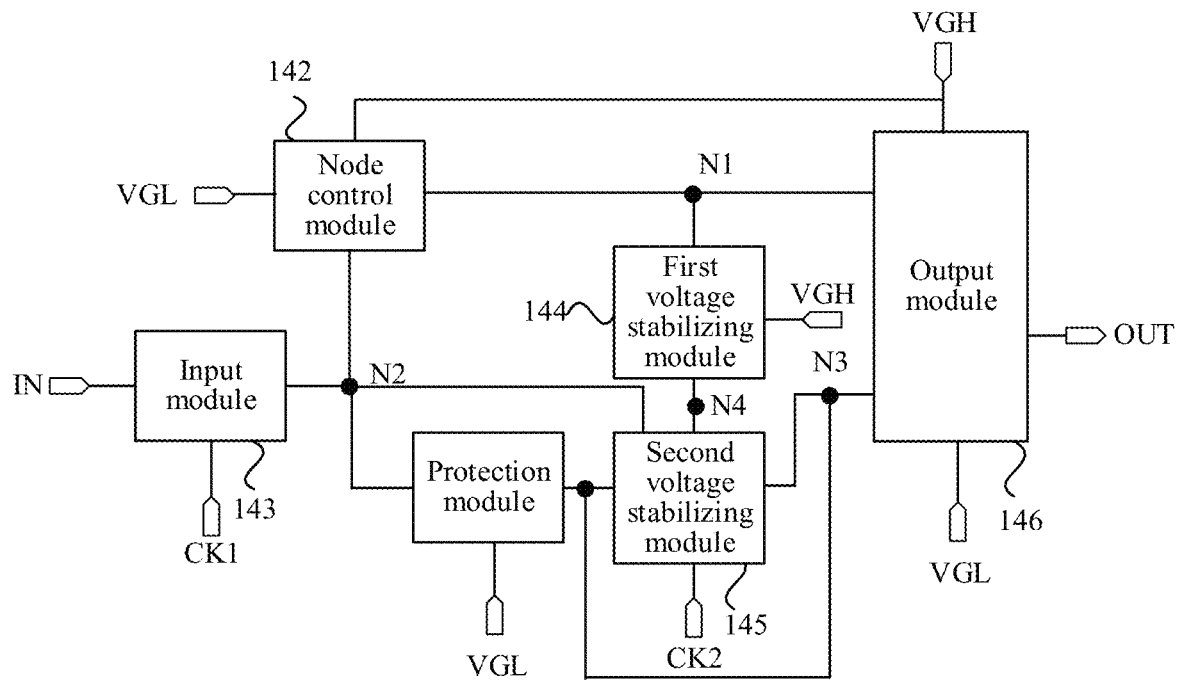
FIG. 8 is a schematic structural diagram of another shift register according to an embodiment of this application.

In some possible embodiments, as shown in FIG. 8, each stage of shift registers ASG further includes: a protection module 147, located between the second node N2 and the third node N3, and between the second node N2 and the second voltage stabilizing module 145, and electrically connected to the first level signal receiving end VGL. The protection module 146 is configured to prevent the signal of the third node N3 from being transmitted to the second node N2, that is, having a cutoff function, thereby preventing the input module 143 from being subjected to a high Vds bias.

Figure 9:
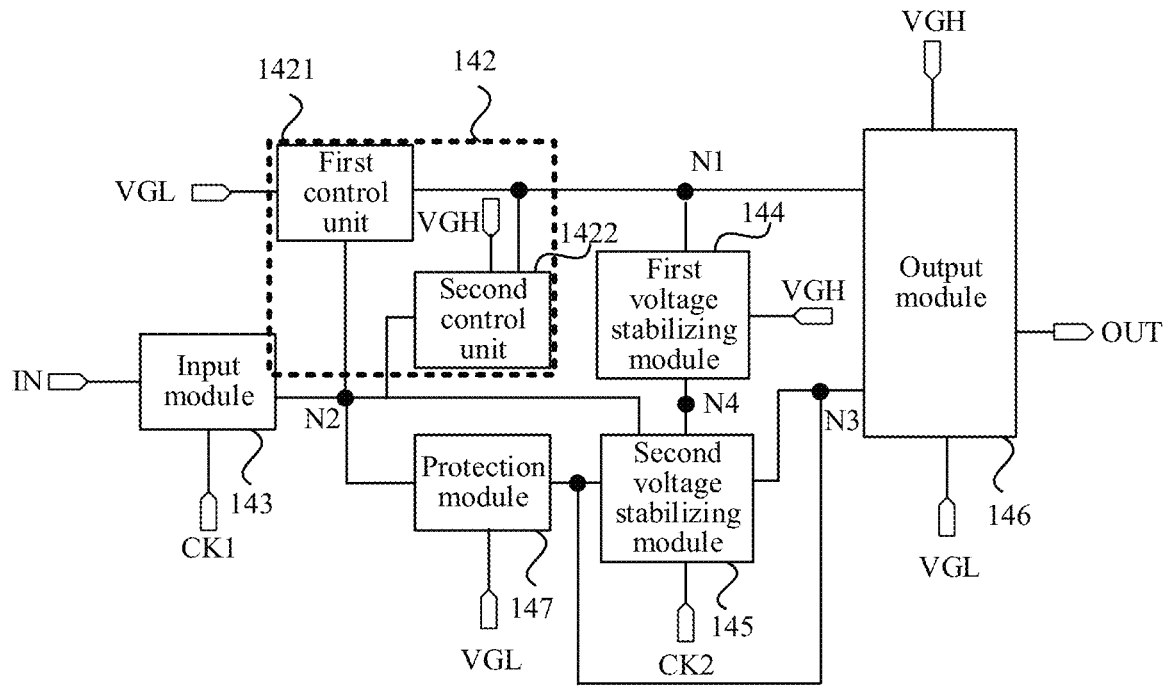
FIG. 9 is a schematic structural diagram of still another shift register according to an embodiment of this application.

In some possible embodiments, referring to FIG. 9, the node control module 142 includes a first control unit 1421 and a second control unit 1422. The first control unit 1421 is electrically connected to the first level signal receiving end VGL, the first node N1, and the second node N2. The second control unit 1422 is electrically connected to the second level signal receiving end VGH, the first node N1, and the second node N2.

The first control unit 1421 is configured to receive the first level signal of the first level signal receiving end VGL and control the signal of the first node N1 in response to the signal of the second node N2; or, the second control unit 1422 is configured to receive the second level signal received by the second level signal receiving end VGH and control the signal of the first node N1 in response to the signal of the second node N2. In other words, the first level signal may be provided to the first node N1 by the first control unit 1421 and the second level signal may be provided to the first node N1 by the second control unit 1422. In other words, when the first node N1 needs a first level signal, the first level signal is transmitted to the first node N1 by the first control unit 1421; when the first node N1 needs a second level signal, the second level signal is transmitted to the first node N1 by the second control unit 1422. In addition, when the first node N1 is the first level signal, the output module 145 outputs, through the drive signal output end OUT, the second level signal received by the second level signal receiving end VGH; when the first node N1 is the second level signal, the output module 145 cannot output, through the drive signal output end OUT, the second level signal received by the second level signal receiving end VGH.

In addition, the first control unit 1421 includes at least one transistor. The transistor is a transistor having an active layer made of an oxide semiconductor material, such as IGZO. Due to the advantage of a low leakage current of an IGZO transistor, when a low level is provided to the first node N1 by the first control unit 1421, the signal stability of the first node N1 can be ensured, and further the signal outputted by the drive signal output end OUT can be ensured to be relatively stable. When the signal outputted by the drive signal output end OUT is a light-emitting control signal (that is, the gate drive circuit is a light-emitting control drive circuit), since the light-emitting control transistors M6 and M7 in the pixel circuit 111 are turned on upon receipt of a low level, the display unit 112 displays; since the light-emitting control transistors in the pixel circuit 111 are turned off upon receipt of a high level, the display unit 112 does not display. In other words, when the light-emitting control signal outputted by the drive signal output end OUT is at a high level, the light-emitting control transistors M6 and M7 are turned off, and the display unit 112 does not display; and when the signal outputted by the drive signal output end OUT is at a low level, the light-emitting control transistors M6 and M7 are turned on, and the display unit 112 displays. In addition, due to the fact that the light-emitting control signal outputted by the drive signal output end OUT is a high-level signal when the first control unit 1421 provides a low level to the first node N1, when the high-level signal outputted by the drive signal output end OUT is stable, the light-emitting control transistors M6 and M7 in the pixel circuit 111 can be ensured to be completely turned off, thereby avoiding the occurrence of a bright screen.

Figure 10:
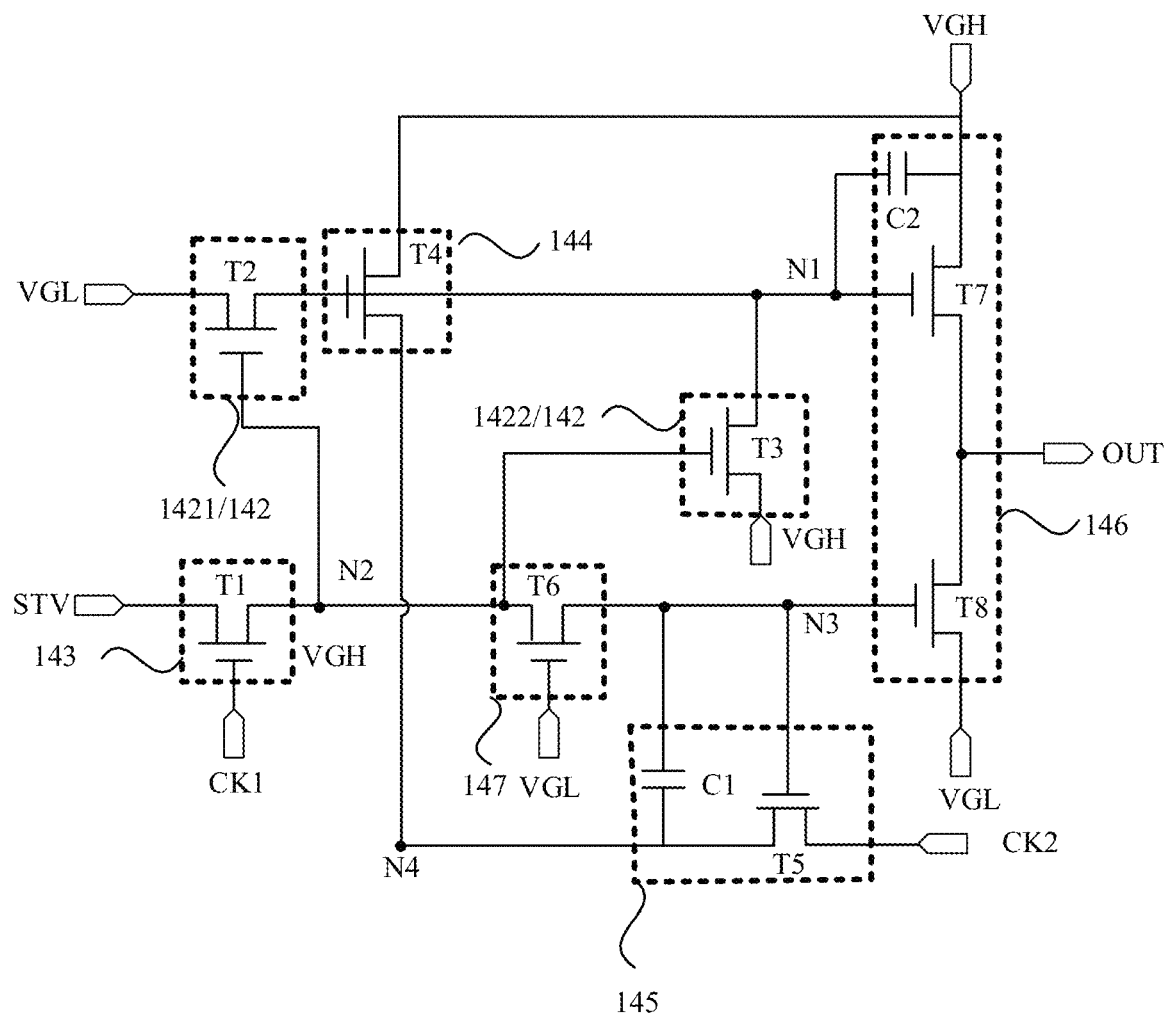
FIG. 10 is a schematic structural diagram of yet still another shift register according to an embodiment of this application.

In some possible embodiments, referring to FIG. 10, the input module 143 includes a first transistor T1, a gate of the first transistor T1 is electrically connected to the first clock signal end CK1, a first pole of the first transistor T1 is electrically connected to the trigger signal input end IN, and the second pole of the first transistor T1 is electrically connected to the second node N2. The first transistor T1 is, for example, a transistor having an active layer made of silicon, optionally polycrystalline silicon, such as LTPS.

It should be noted that a first pole of the first transistor T1 may be a source electrode of the first transistor T1, and a second pole of the first transistor T1 may be a drain electrode of the first transistor T1; or, a first pole of the first transistor T1 may be a drain electrode of the first transistor T1, and a second pole of the first transistor T1 may be the source electrode of the first transistor T1. The transistors in the following embodiments are the same, and details are not repeated in the following embodiments.

In some possible embodiments, referring to FIG. 10, the first control unit 1421 includes a second transistor T2. A gate of the second transistor T2 is electrically connected to the second node N2, a first pole of the second transistor T2 is electrically connected to the first level signal receiving end VGL, and a second pole of the second transistor T2 is electrically connected to the first node N1. The second transistor T2 is a transistor having an active layer made of an oxide semiconductor material, such as IGZO.

In some possible embodiments, referring to FIG. 10, the second control unit 1422 includes a third transistor T3. A gate of the third transistor T3 is electrically connected to the second node N2, a first pole of the third transistor T3 is electrically connected to the second level signal receiving end VGH, and a second pole of the third transistor T3 is electrically connected to the first node N1.

In some possible embodiments, referring to FIG. 10, the first voltage stabilizing module 144 includes a fourth transistor T4. A gate of the fourth transistor T4 is electrically connected to the first node N1, a first pole of the fourth transistor T4 is electrically connected to the second level signal receiving end VGH, and a second pole of the fourth transistor T4 is electrically connected to the fourth node N4. The fourth transistor T4 is, for example, a transistor having an active layer made of silicon, optionally polycrystalline silicon, such as LTPS.

In some possible embodiments, referring to FIG. 10, the second voltage stabilizing module 145 includes a fifth transistor T5 and a first capacitor C1. A gate of the fifth transistor T5 is electrically connected to the third node N3, a first pole of the fifth transistor T5 is electrically connected to the second clock signal end CK2, a second pole of the fifth transistor T5 is electrically connected to the second pole of the first capacitor C1, and a first pole of the first capacitor C1 is electrically connected to the third node N3 and the protection module 147, separately. The fifth transistor T5 is, for example, a transistor having an active layer made of silicon, optionally polycrystalline silicon, such as LTPS.

In some possible embodiments, referring to FIG. 10, the protection module 146 includes a sixth transistor T6. A gate of the sixth transistor T6 is electrically connected to the first level signal receiving end VGL, a first pole of the sixth transistor T6 is electrically connected to the second node N2, and a second pole of the sixth transistor T6 is electrically connected to the first pole of the third node N3 and the first capacitor point C1, separately. The sixth transistor T6 is, for example, a transistor having an active layer made of silicon, optionally polycrystalline silicon, such as LTPS.

In some possible embodiments, referring to FIG. 10, the output module 145 includes a second capacitor C2, a seventh transistor T7, and an eighth transistor T8. Both a gate of the seventh transistor T7 and a first pole of the second capacitor C2 are electrically connected to the first node N1, both a first pole of the seventh transistor T7 and a second pole of the second capacitor C2 are electrically connected to the second level signal receiving end VGH, both a second pole of the seventh transistor T7 and a second pole of the eighth transistor T8 are electrically connected to the drive signal output end OUT, a gate of the eighth transistor T8 is electrically connected to the third node N3, and a first pole of the eighth transistor T8 is electrically connected to the first level signal receiving end VGL. Both the seventh transistor T7 and eighth transistor T8 are, for example, transistors having an active layer made of silicon, optionally polycrystalline silicon, such as LTPS.

The above provides a specific introduction to the structure of the gate drive circuit, and the following describes the working process when the gate drive circuit is a light-emitting control drive circuit.

Figure 11:
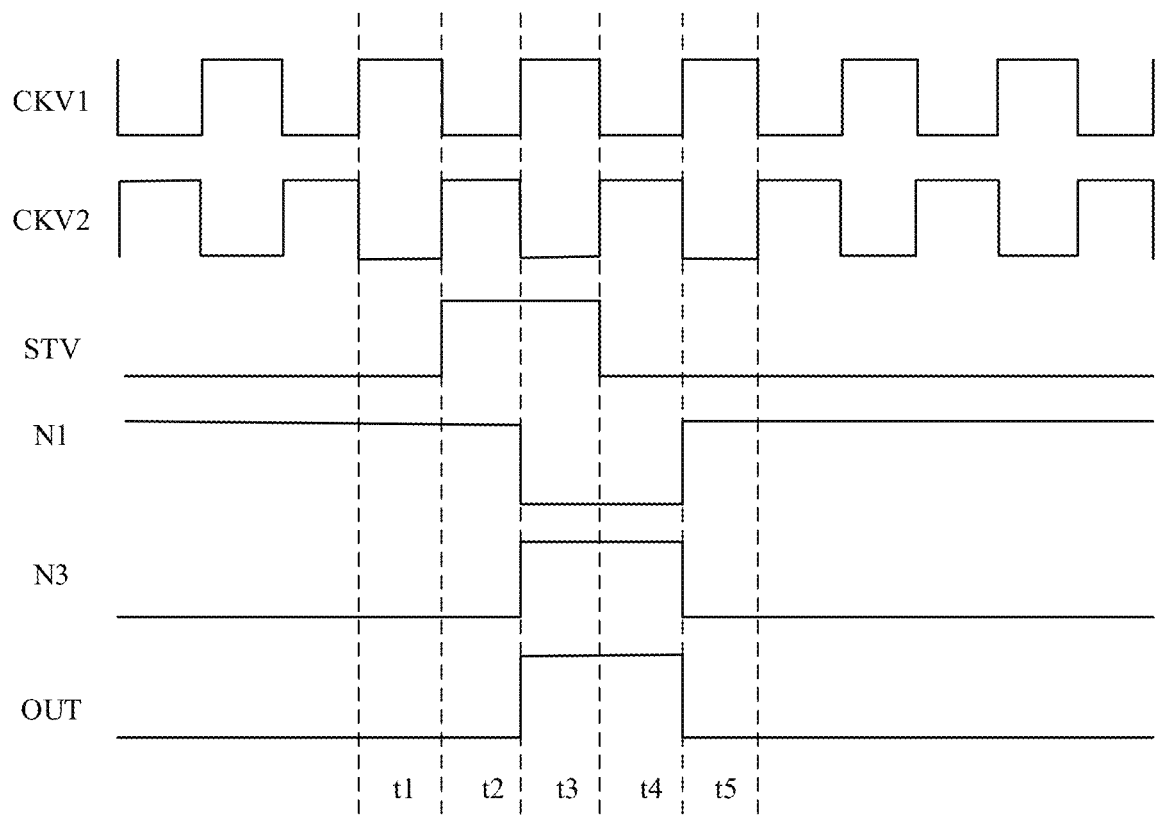
FIG. 11 is a schematic timing diagram of a shift register according to an embodiment of this application.

FIG. 11 shows the timing diagram of signals in a shift register when the gate drive circuit is a light-emitting control drive circuit. The following explains the working process of the shift register shown in FIG. 10 by combining the timing diagrams of the signals in the shift register when the gate drive circuit is the light-emitting control drive circuit. Timing of the signals in a shift register of another structure is basically the same, and details are not repeated again herein. For example, the second transistor T2 is an N-type IGZO transistor, the first transistor T1, the third transistor T3, the fourth transistor T4, the fifth transistor T5, the sixth transistor T6, the seventh transistor T7, and the eighth transistor T8 are P-type LTPS transistors, the first level signal received by the first level signal receiving end VGL is −7 V. and the second level signal received by the second level signal receiving end VGH is 7 V.

Figure 12:
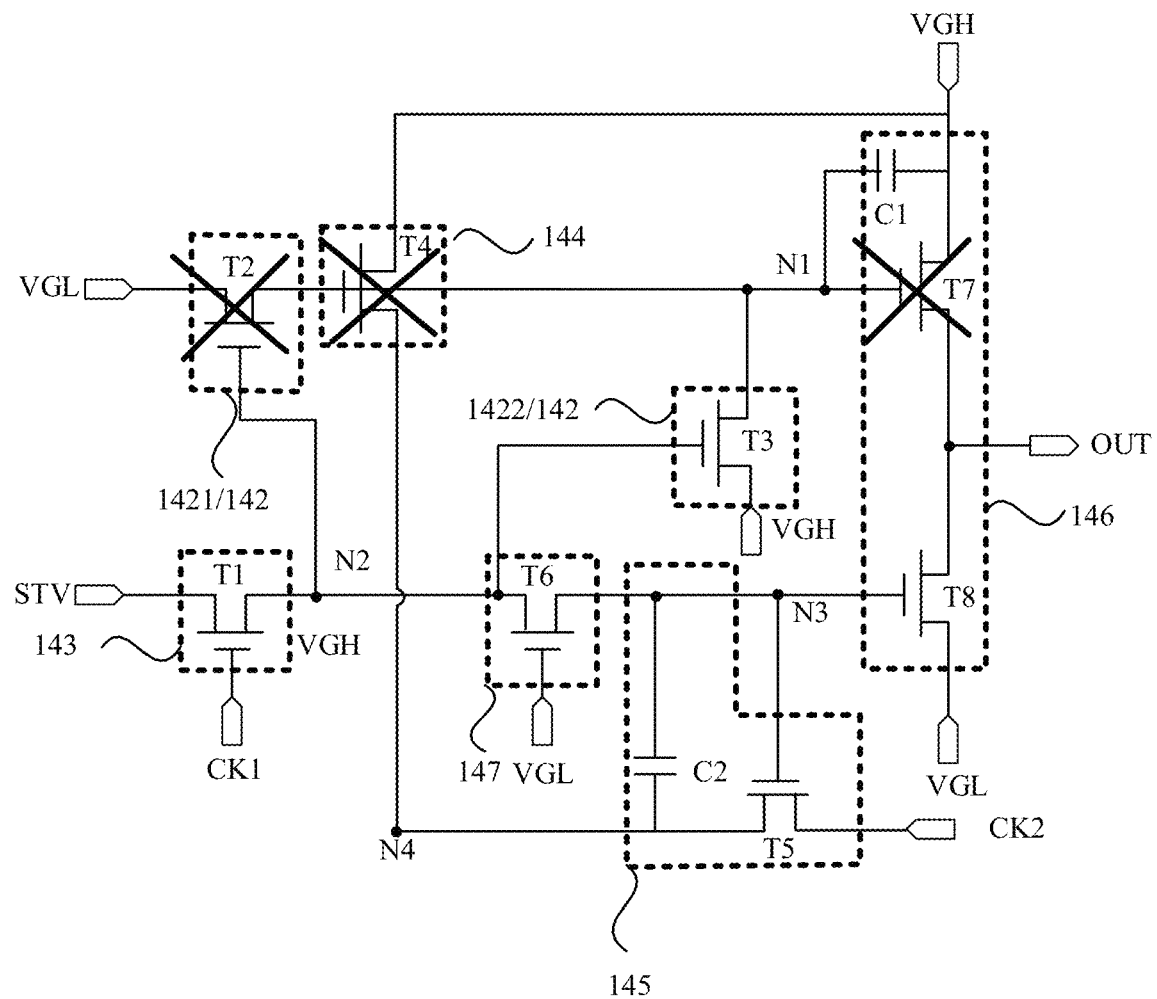
FIG. 12 is a working process diagram of a shift register according to an embodiment of this application.

In a first stage t1, that is, in a data setting stage of an input signal STV: In combination with FIG. 12. CKV1 received by the first clock signal end CK1 changes from a high level to a low level. CKV2 received by the second clock signal end CK2 changes from a low level to a high level, the first transistor T1 is turned on, and the fifth transistor T5 is turned on, so that the low level of the input signal STV received by the trigger signal input end IN is written to the third node N3, and that the third node N3 is pulled down. The low level of the input signal STV causes the second transistor T2 to be turned off and the third transistor T3 to be turned on, so that the first node N1 is set high and that the seventh transistor T7 is turned off. Turn-off of the fourth transistor T4 does not affect pull-down of the first capacitor C1 and the fifth transistor T5, and in this case, the light-emitting control signal outputted by the drive signal output end OUT is still at a low level.

Figure 13:
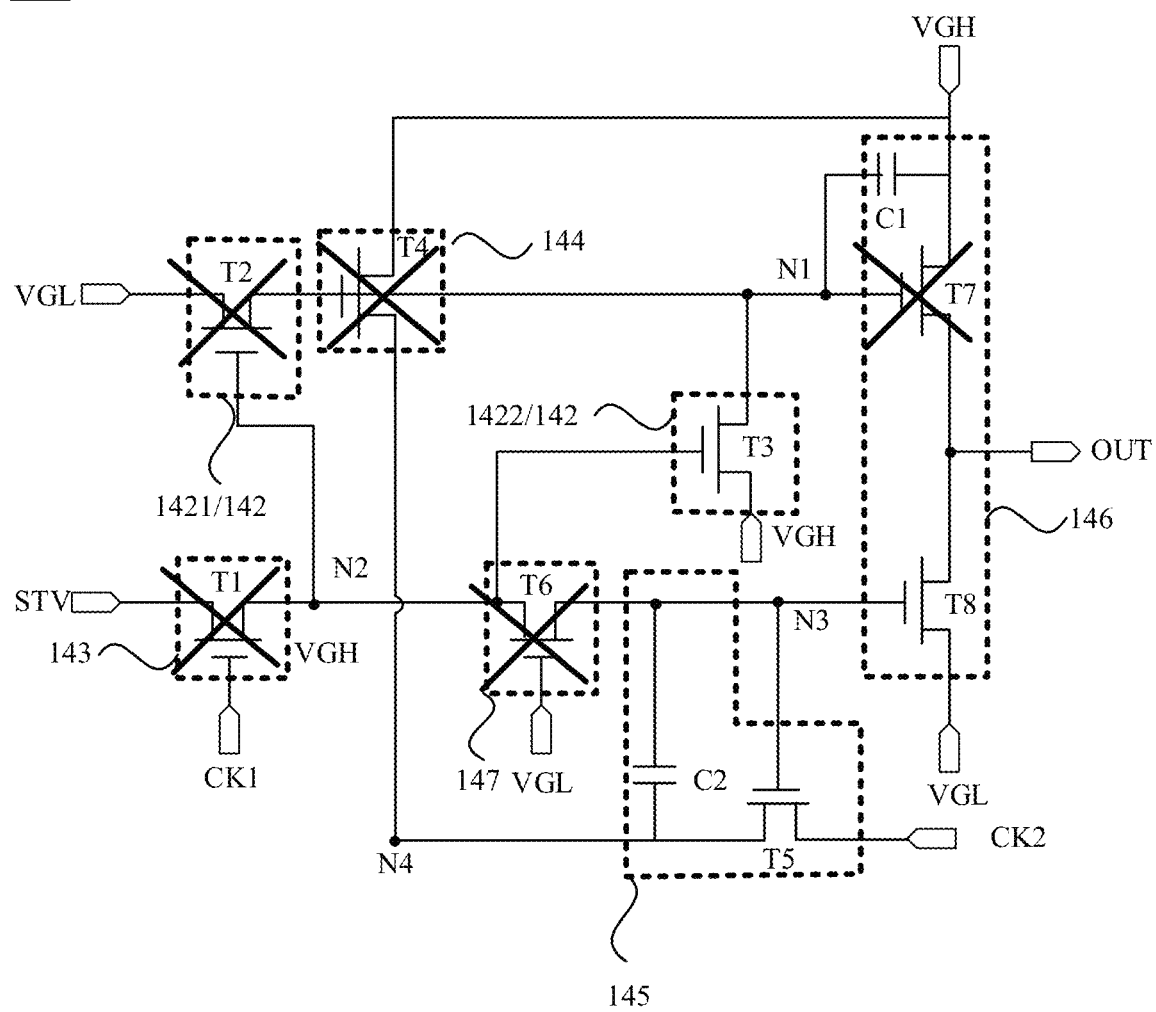
FIG. 13 is a working process diagram of another shift register according to an embodiment of this application.

In a second stage t2, that is, in a coupling pull-down stage of the first capacitor: In combination with FIG. 13. CKV1 received by the first clock signal end CK1 changes from a low level to a high level. CKV2 received by the second clock signal end CK2 changes from a high level to a low level, so that the first transistor T1 and the sixth transistor T6 are turned off, and that the third node N3 is at a low potential. The fifth transistor T5 is turned on. When the low level of CKV2 approaches, the third node N3 is pulled to a lower potential through a capacitive coupling effect of the first capacitor C1. That is, the third node N3 is pulled down to a potential lower than the low level received by the first level signal receiving end VGL, and in this way, the eighth transistor T8 can output the low level received by the first level signal receiving end VGL, that is, to compensate for a threshold loss of the eighth transistor T8, the light-emitting control signal outputted by the drive signal output end OUT is enabled to be at the low level received by the first level signal receiving end VGL.

Figure 14:
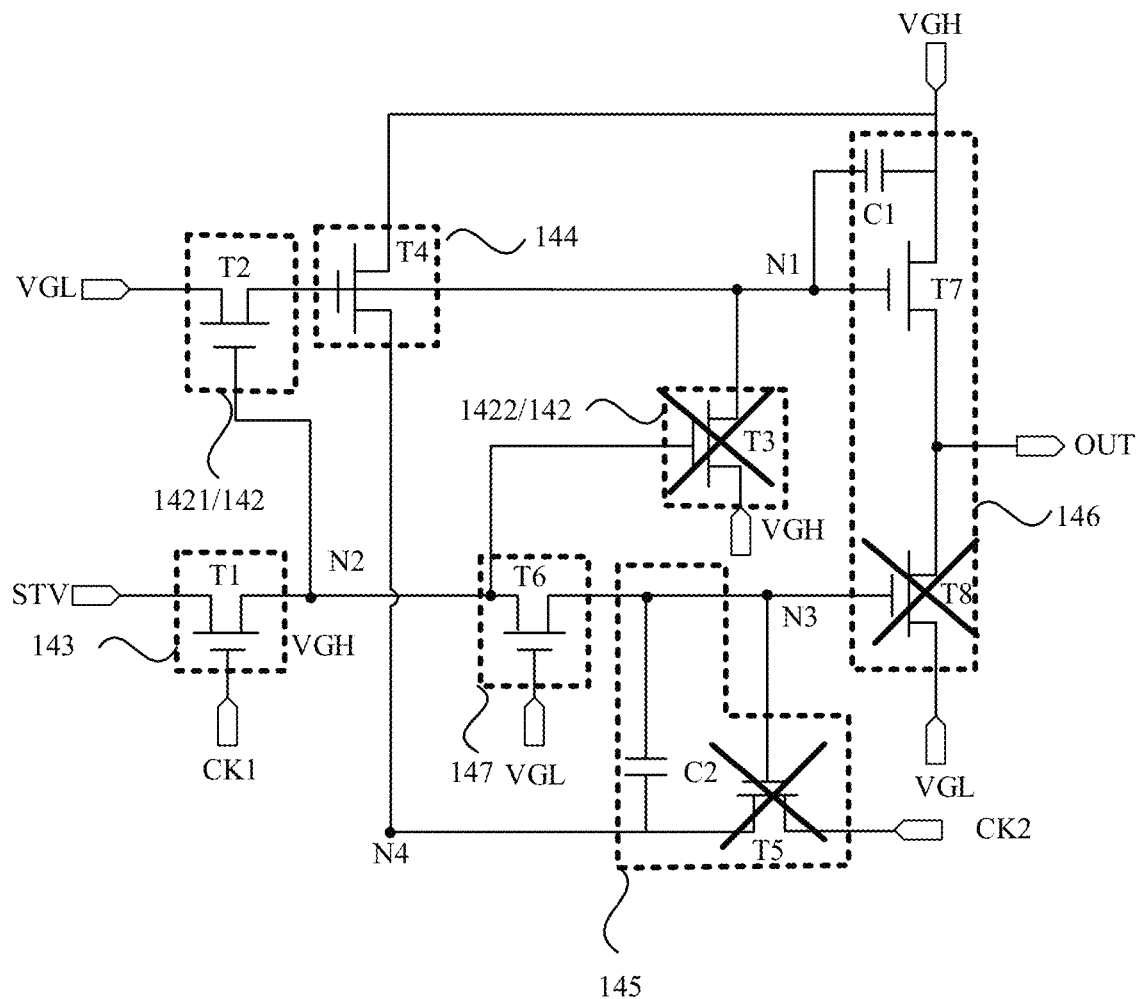
FIG. 14 is a working process diagram of still another shift register according to an embodiment of this application.

In a third stage t3, that is, in a STV high level re-input stage: In combination with FIG. 14. CKV1 received by the first clock signal end CK1 changes from a high level to a low level. CKV2 received by the second clock signal end CK2 changes from a low level to a high level, the first transistor T1 is turned on, and the sixth transistor T6 is turned on, so that the high level of the input signal STV received by the trigger signal input end IN is written to the second node N2 and the third node N3, that the second node N2 and the third node N3 are pulled up, and that the third transistor T3 and the eighth transistor T8 are turned off. In addition, the high level of the second node N2 causes the second transistor T2 to be turned on, so that the low level received by the first level signal receiving end VGL is written to the first node N1, that the seventh transistor T7 is turned on, and that the light-emitting control signal outputted by the drive signal output end OUT changes to a high level. Further, the fourth transistor T4 is turned on the capacitive coupling structure between the first capacitor C1 and the fifth transistor T5 does not work, and the high level transmitted after the fourth transistor T4 is turned on is written to the fourth node N4 (that is, a second pole of the first capacitor C1). Due to a voltage stabilizing effect of the capacitor, the signal of the third node N3 is stable, and further the stability of the circuit structure is ensured.

Figure 15:
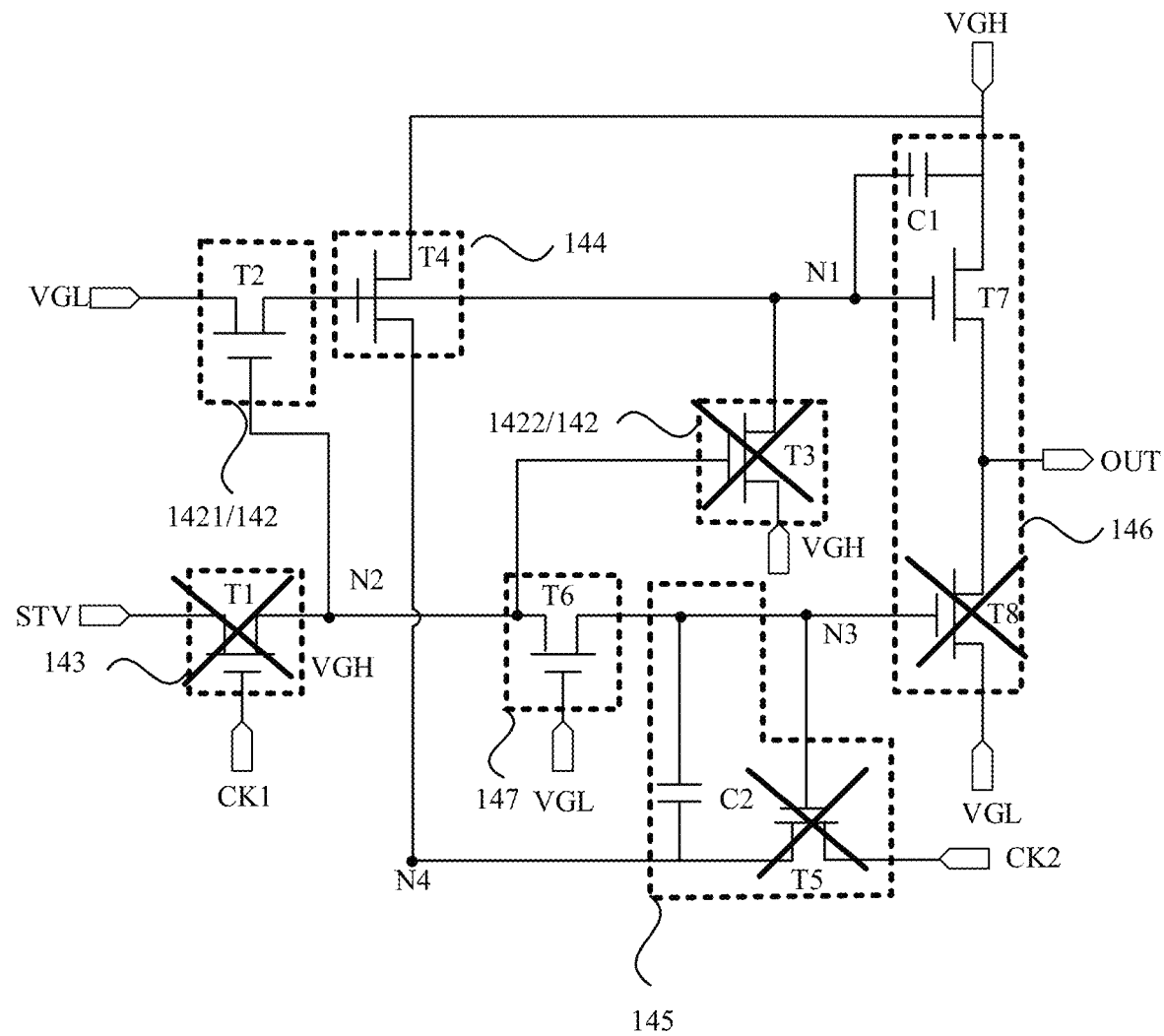
FIG. 15 is a working process diagram of yet still another shift register according to an embodiment of this application.

In a fourth stage t4, in a holding stage of a high level outputted by the drive signal output end OUT: In combination with FIG. 15. CKV1 received by the first clock signal end CK1 changes from a low level to a high level. CKV2 received by the second clock signal end CK2 changes from a high level to a low level, and the first transistor T1 is turned off. Due to the holding effect of the first capacitor C1, the second transistor T2 is continuously turned on, the first node N1 remains at the low level, and the fourth transistor T4 remains on. In addition. CKV2 that hops cannot affect the voltage of the third node N3, and the light-emitting control signal outputted by the drive signal output end OUT remains at a high potential.

Figure 16:
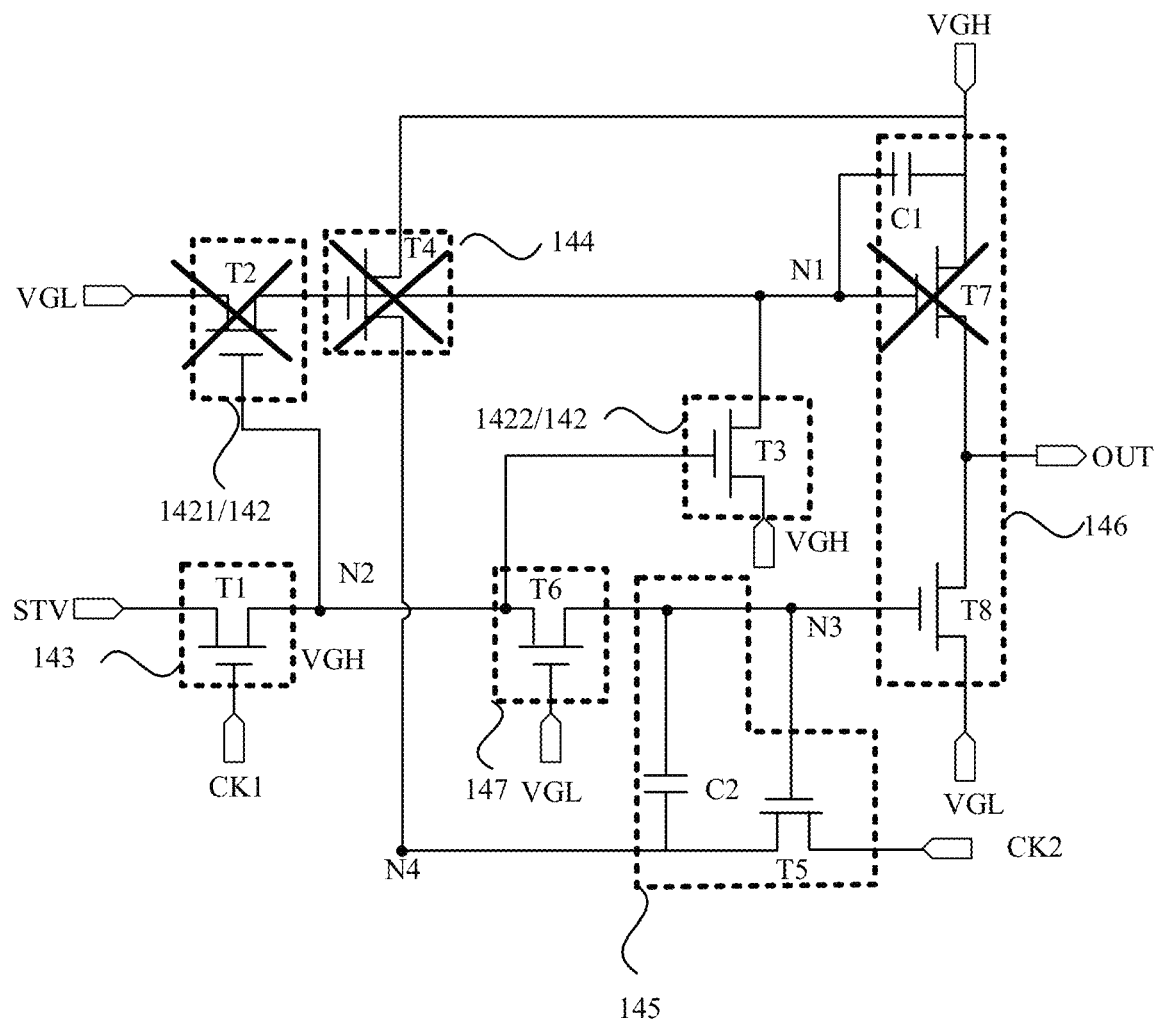
FIG. 16 is a working process diagram of further yet still another shift register according to an embodiment of this application.

In a fifth stage t5, in an STV low-level re-pull-down stage: In combination with FIG. 16. CKV1 received by the first clock signal end CK1 changes from a high level to a low level. CKV2 received by the second clock signal end CK2 changes from a low level to a high level, the first transistor T1 is turned on, and the fifth transistor T5 is turned on, so that the low level of the input signal STV received by the trigger signal input end IN is written to the third node N3, that the third node N3 is pulled down, and that the eighth transistor T8 is turned on. The low level of the input signal STV causes the second transistor T2 to be turned off and the third transistor T3 to be turned on, so that the first node N1 is set high, that the seventh transistor T7 is turned off, and that the light-emitting control signal outputted by the drive signal output end OUT is at a low potential. However, due to the threshold loss of the eighth transistor T8, the signal outputted by the drive signal output end OUT cannot reach the low-level signal received by the first level signal receiving end VGL. When a next CLK2 pulse arrives, the third node N3 is pulled to a lower potential through the capacitive coupling effect of the first capacitor C1 and the fifth transistor T5, and the light-emitting control signal outputted by the drive signal output end OUT is the low-level signal received by the first level signal receiving end VGL.

When the light-emitting control signal outputted by the drive signal output end OUT is at a low level, the signal of the third node N3 is controlled by the fifth transistor T5 and the first capacitor C1, so that the potential of the signal of the third node N3 is lower than the potential of the low level received by the first level signal receiving end VGL, and further that the light-emitting control signal outputted by the drive signal output end OUT is enabled to be at the low level received by the first level signal receiving end VGL, thereby avoiding the situation, in which the first level signal received by the eighth transistor T8 from the first level signal receiving end VGL cannot be transmitted to the control drive signal output end OUT due to a threshold loss of the eighth transistor T8, and which further affects output of the light-emitting control signal. In addition, when the signal of the first node N1 is at a high level, control by the fifth transistor T5 and the first capacitor C1 causes the signal of the third node N3 to be at a low level (opposite to the potential of the first node N1). When the signal of the first node N1 is at a low level, the potential of the first node N1 controls the fourth transistor T4 (the first voltage stabilizing module 144), to write the high level to the fourth node N4 through the fourth transistor T4. Due to the voltage stabilizing effect of the first capacitor C1, the potential of the third node N3 (high level) is opposite to the potential of the first node N1 (low level), and in this way, the potentials of the third node N3 and the first node N1 can always be opposite, there is no situation where both the seventh transistor T7 and the eighth transistor T8 are turned off, avoiding circuit instability due to the fact that the output signal is extremely prone to be affected by a load in a case that there is a dangling point in the output signal when both the seventh transistor T7 and the eighth transistor T8 are turned off. In addition, since the second transistor T2 of the first control unit 1421 is an IGZO transistor (having the advantage of a low leakage current), when a low level is provided to the first node N1 by the first control unit 1421, the signal stability of the first node N1 can be ensured, and further the stability of the light-emitting control signal outputted by the drive signal output end OUT can be ensured, thereby avoiding the occurrence of a bright screen. In addition, since the shift register ASG is integrated with an IGZO transistor and an LTPS transistor and integrated with an N-type transistor and a P-type transistor, the shift register ASG can have the characteristics of a relatively strong drive capability and a low power consumption, and the number of thin film transistors required for the shift register ASG is effectively reduced. That is, the shift register ASG merely includes eight transistors and two capacitors, and has a simple circuit structure and timing, and relatively simple wiring, and an occupied area thereof can be effectively reduced, thereby facilitating the narrow border design of the display panel. In addition, it has been verified that by using the gate drive circuit, the disadvantage of current leakage of the LTPS transistor can be effectively overcome.

In addition, since a threshold voltage of an LTPS transistor is prone to be affected by an external electric field, a threshold voltage shift is generated, which further affects the signal output of the drive signal output end OUT. It has been verified that by using the gate drive circuit including an IGZO transistor provided in this embodiment of this application, a relatively stable waveform can still be outputted by the drive signal output end OUT even if a threshold voltage offset of the LTPS transistor is relatively large (the threshold voltage is offset by −2.5 V to 2 V), thereby providing a particular error tolerance for the process.

To provide a detailed explanation of this beneficial effect, a description is provided below by comparison with the related technologies (as shown in FIG. 1).

Figure 17:
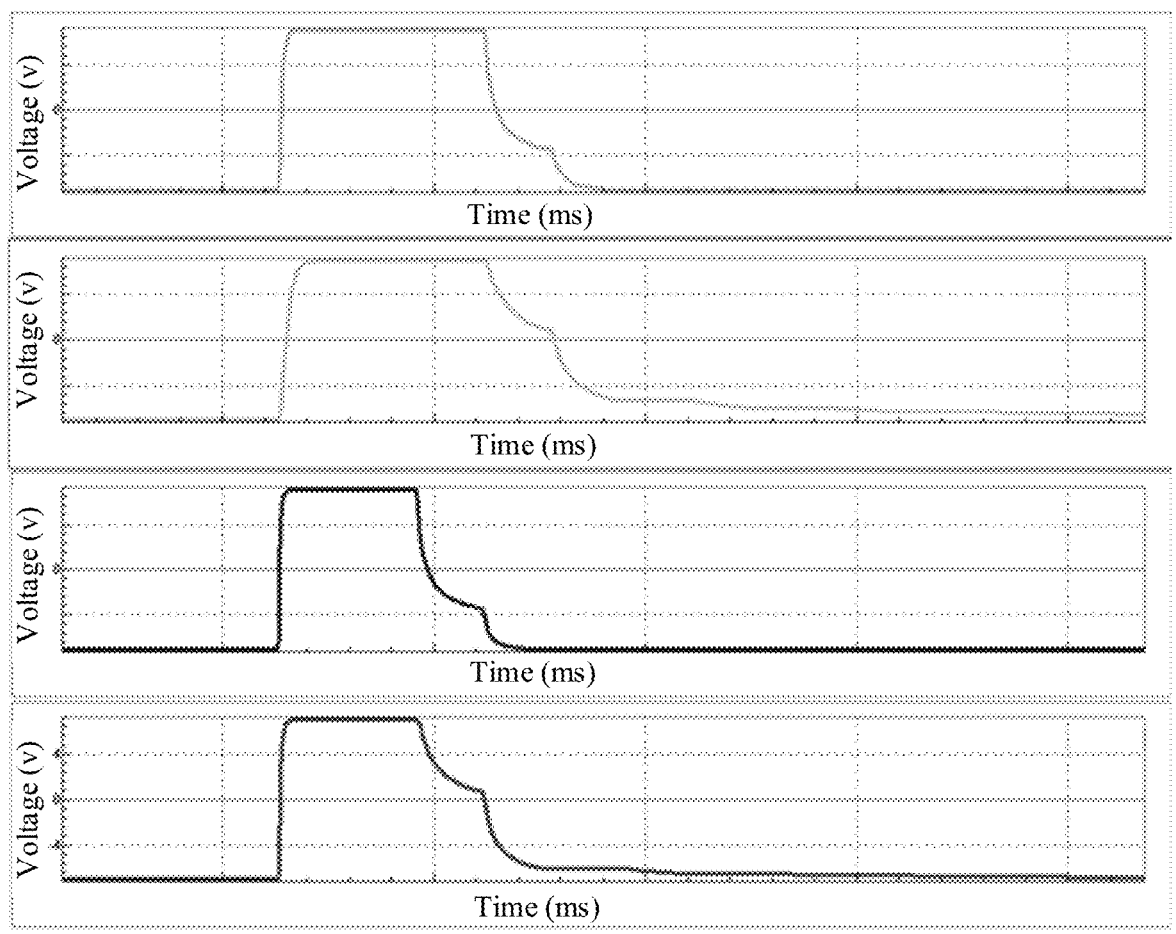
FIG. 17 is a simulation comparison diagram of the related technologies and an embodiment of this application.
Figure 18:
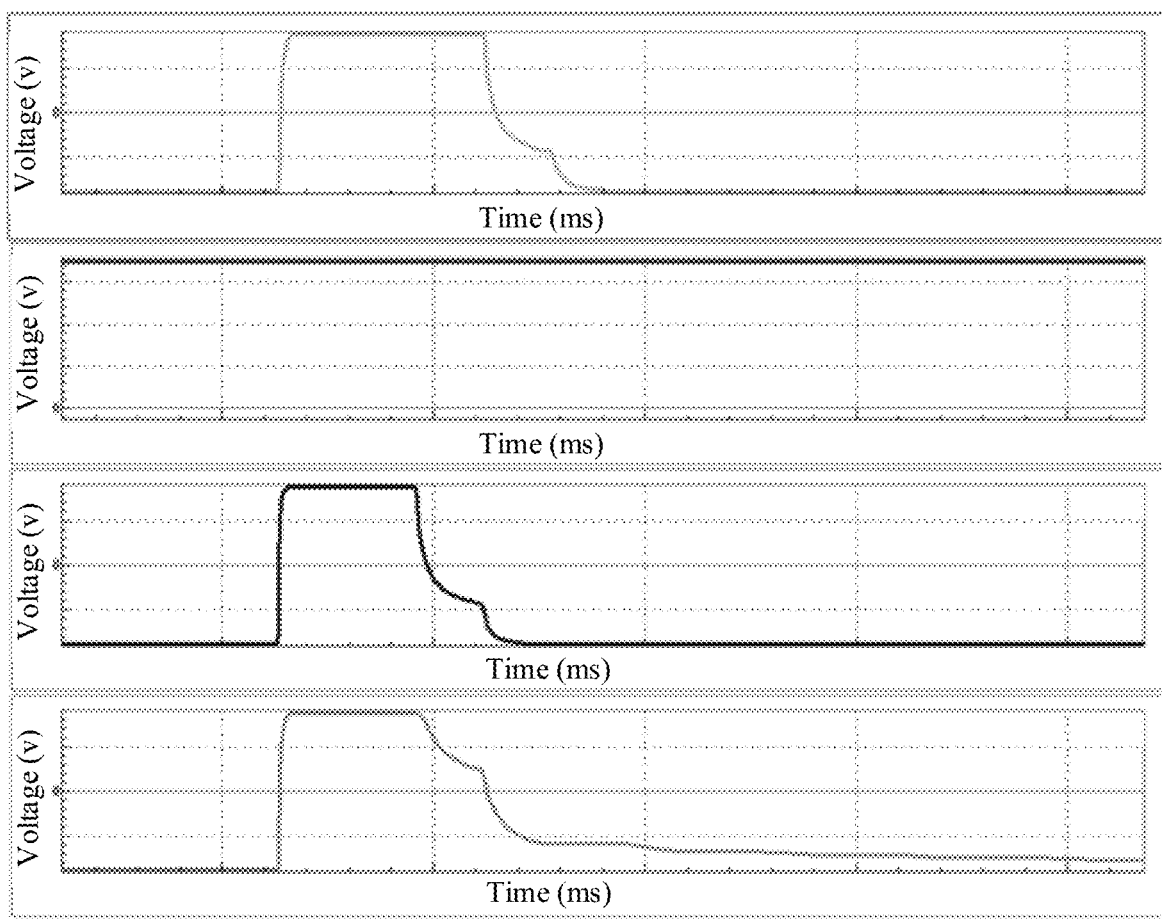
FIG. 18 is another simulation comparison diagram of the related technologies and an embodiment of this application.
Figure 19:
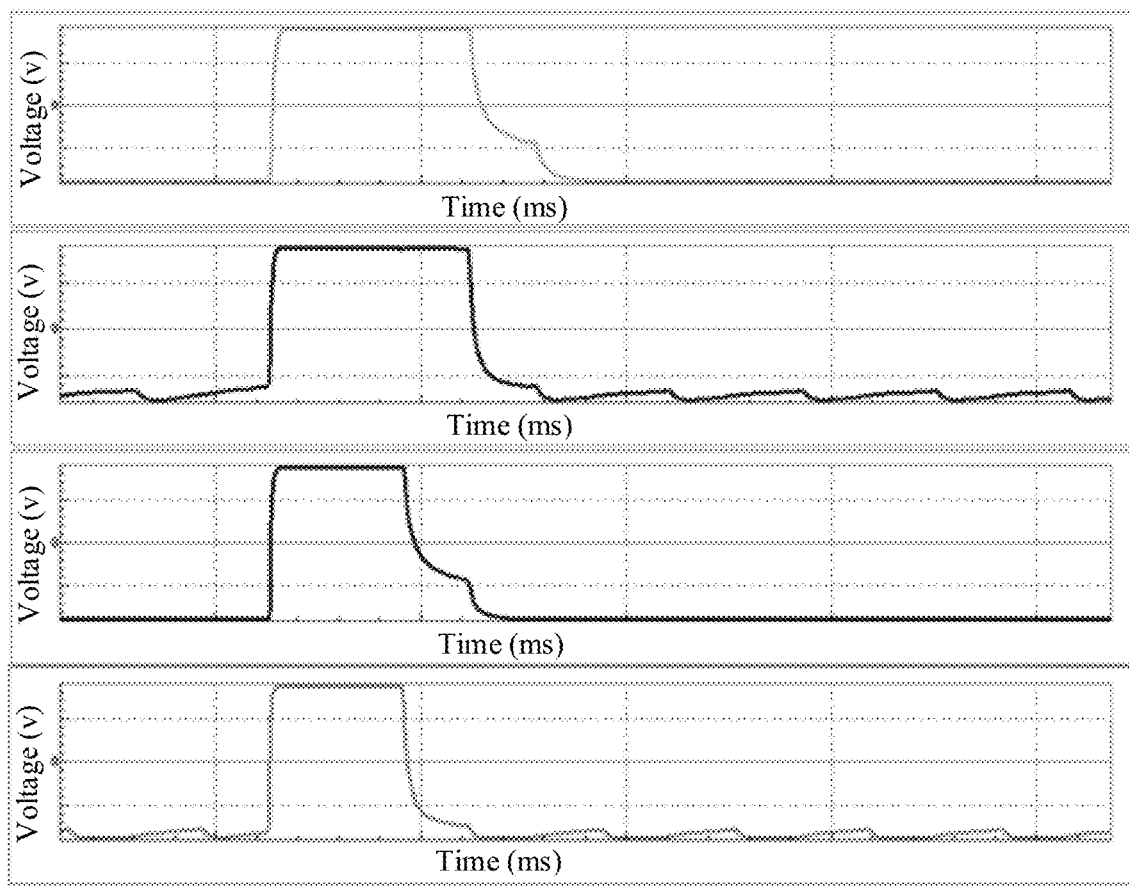
FIG. 19 is still another simulation comparison diagram of the related technologies and an embodiment of this application.
Figure 20:
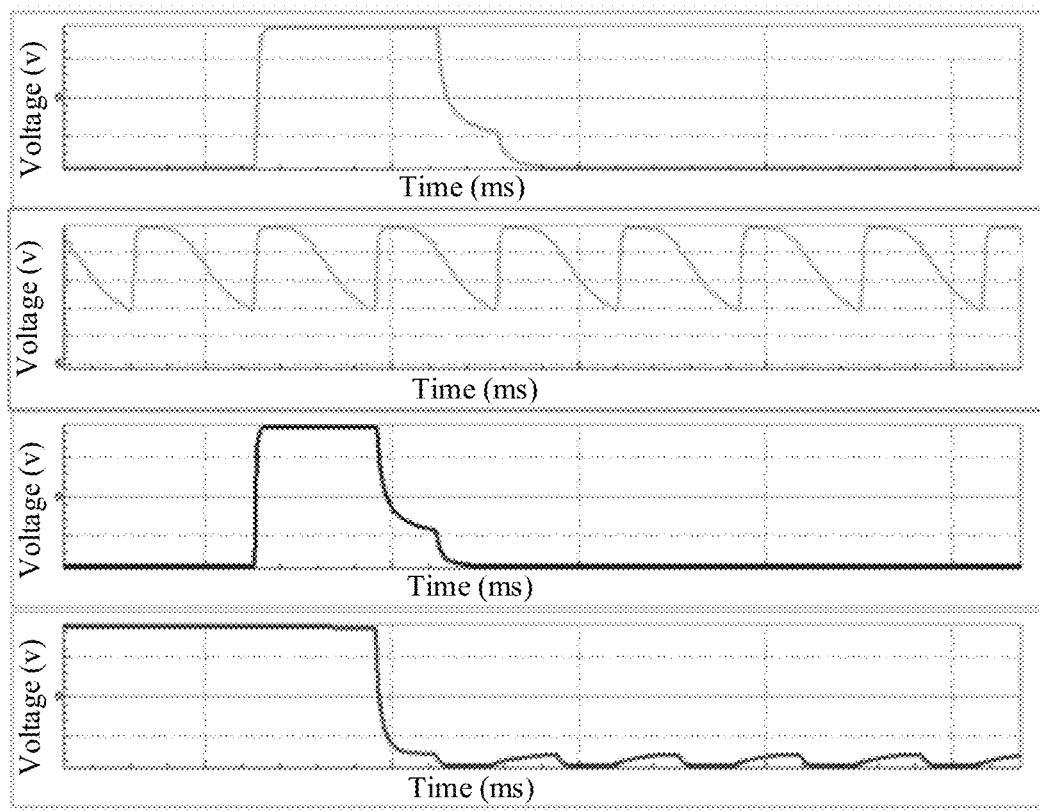
FIG. 20 is yet still another simulation comparison diagram of the related technologies and an embodiment of this application.

FIG. 17. FIG. 18. FIG. 19, and FIG. 20 all show comparative simulation diagrams of the related technologies with this embodiments of this application, where the horizontal axis represents time and the vertical axis represents the signal outputted by the drive signal output end OUT during simulation.

The four simulation results in FIG. 17, from top to bottom, are: a signal at the drive signal output end OUT when the threshold voltage of the LTPS transistor in related technologies is offset by 0 V; a signal at the drive signal output end OUT when the threshold voltage of the LTPS transistor in related technologies is offset by −2 V; a signal at the drive signal output end OUT when the threshold voltage of the LTPS transistor in this embodiment of this application is offset by 0 V; and a signal at the drive signal output end OUT when the threshold voltage of the LTPS transistor in this embodiment of this application is offset by −2 V. As can be seen from FIG. 17, when the threshold voltages of the LTPS transistors in both the related technologies and this embodiment of this application are offset by 0) V and −2 V, the signals outputted by the drive signal output end in both the related technologies and this embodiment of this application are normal.

The four simulation results in FIG. 18, from top to bottom, are: a signal at the drive signal output end OUT when the threshold voltage of the LTPS transistor in related technologies is offset by 0 V; a signal at the drive signal output end OUT when the threshold voltage of the LTPS transistor in related technologies is offset by −2.5 V; a signal at the drive signal output end OUT when the threshold voltage of the LTPS transistor in this embodiment of this application is offset by 0 V; and a signal at the drive signal output end OUT when the threshold voltage of the LTPS transistor in this embodiment of this application is offset by −2.5 V. As can be seen from FIG. 18, when the threshold voltages of the LTPS transistors in both the related technologies and this embodiment of this application are offset by 0 V, the signals outputted by the drive signal output end in both the related technologies and this embodiment of this application are normal. However, when the threshold voltage of the LTPS transistor in both the related technologies and this embodiment of this application are offset by −2.5 V, the outputted signals in the related technologies are abnormal, that is, the shift register of the related technologies is invalid, and the outputted signals in this embodiment of this application are still normal.

The four simulation results in FIG. 19, from top to bottom, are: a signal at the drive signal output end OUT when the threshold voltage of the LTPS transistor in related technologies is offset by 0 V; a signal at the drive signal output end OUT when the threshold voltage of the LTPS transistor in related technologies is offset by 2 V; a signal at the drive signal output end OUT when the threshold voltage of the LTPS transistor in this embodiment of this application is offset by 0 V; and a signal at the drive signal output end OUT when the threshold voltage of the LTPS transistor in this embodiment of this application is offset by 2 V. As can be seen from FIG. 19, when the threshold voltages of the LTPS transistors in both the related art and this embodiment of this application are offset by 0 V and 2 V, the signals outputted by the drive signal output end in both the related art and this embodiment of this application are normal.

The four simulation results in FIG. 20, from top to bottom, are: a signal at the drive signal output end OUT when the threshold voltage of the LTPS transistor in related technologies is offset by 0 V; a signal at the drive signal output end OUT when the threshold voltage of the LTPS transistor in related technologies is offset by 2.5 V; a signal at the drive signal output end OUT when the threshold voltage of the LTPS transistor in this embodiment of this application is offset by 0 V; and a signal at the drive signal output end OUT when the threshold voltage of the LTPS transistor in this embodiment of this application is offset by 2.5 V. As can be seen from FIG. 20, when the threshold voltages of the LTPS transistors in both the related technologies and this embodiment of this application are offset by 0 V, the signals outputted by the drive signal output end in both the related technologies and this embodiment of this application are normal. However, when the threshold voltage of the LTPS transistor in both the related technologies and this embodiment of this application are offset by 2.5 V, the outputted signals in both the related technologies and this embodiment of this application are abnormal.

Hence, for the gate drive circuit including an IGZO transistor provided in this embodiment of this application, the circuit as a light-emitting control drive circuit can still output a relatively stable waveform when the LTPS threshold voltage is offset by −2.5 V to 2 V (which is −2 V to 2 V in the related technologies), thereby providing a particular error tolerance for the process.

It should be noted that The above is an example of the characteristics of a particular batch of transistors, aimed at expressing that this proposal can tolerate a larger threshold voltage offset range and leave a higher tolerance for a process window. An actual tolerable offset value is not limited herein.

Figure 21:
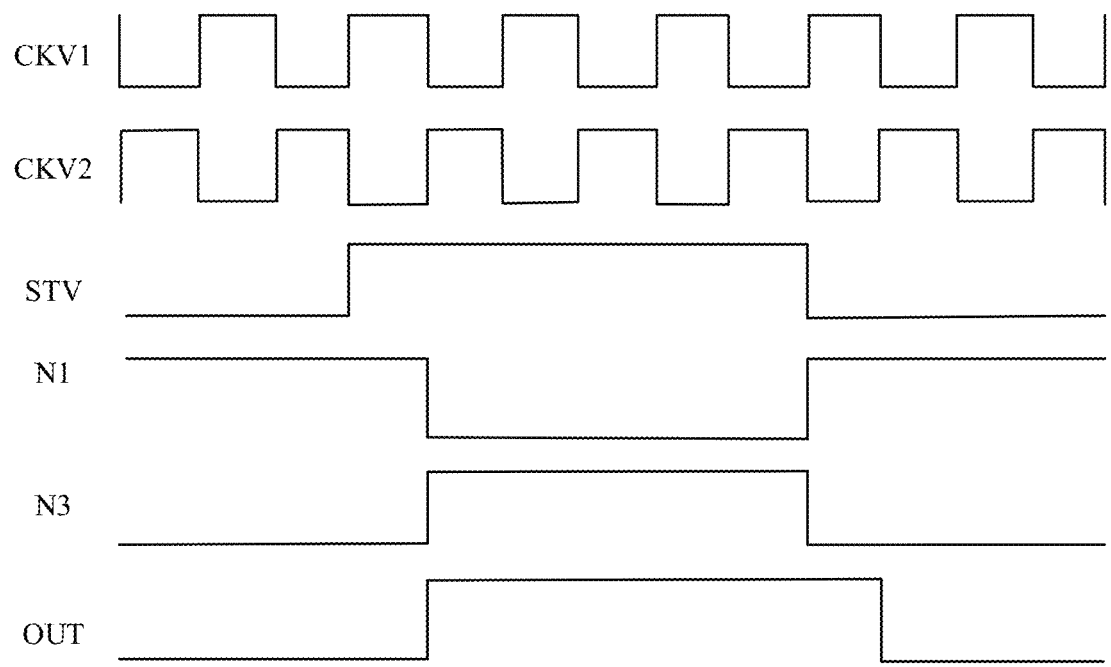
FIG. 21 is a schematic timing diagram of another shift register according to an embodiment of this application.

In addition, the gate drive circuit provided in this embodiment of this application supports pulse width modulation (pulse width modulation, PWM). Based on the clock cycle, by lengthening the pulse width of the output signal STV, the time of the output pulse can be adjusted randomly. Therefore, the output pulse width can be flexibly adjusted according to different needs in low gray-scale displaying. Exemplarily, referring to FIG. 21, FIG. 21 shows a schematic diagram of voltages of nodes when the pulse width of the signal STV is three clock cycles. The signal outputted by the drive signal output end OUT is also three clock cycles.

It should be noted that when the gate drive circuit is the first scan drive circuit, only the input signal STV is different, and further based on the input signal STV and the circuit structure, the working process thereof is changed. The working process and the generated effect are basically the same as the foregoing examples, and details are not repeated again herein.

As stated above, the foregoing embodiments are merely intended for describing the technical solutions of this application, but are not for limiting this application. Although the embodiments of this application are described in detail with reference to the foregoing embodiments, it should be appreciated by a person of ordinary skill in the art that, modifications may still be made to the technical solutions described in the foregoing embodiments, or equivalent replacements may be made to the part of the technical features; and these modifications or replacements do not cause the essence of corresponding technical solutions to depart from the scope of the technical solutions in the embodiments of this application.

What is claimed is:

1. A shift register, comprising:
    a node control module, electrically connected to a first level signal receiving end, a second level signal receiving end, a first node, and a second node;
    an input module, electrically connected to a first clock signal end, a trigger signal input end, and the second node;
    an output module, electrically connected to the first level signal receiving end, the second level signal receiving end, the first node, a third node, and a drive signal output end;
    a first voltage stabilizing module, electrically connected to the first node, a fourth node, and the second level signal receiving end;
    a second voltage stabilizing module, electrically connected to the second node, the third node, the fourth node, and a second clock signal end, wherein
    the input module is configured to receive an input signal of the trigger signal input end and control a signal of the second node in response to a first clock signal received by the first clock signal end;
    the node control module is configured to receive a first level signal received by the first level signal receiving end and a second level signal received by the second level signal receiving end and control a signal of the first node in response to the signal of the second node;
    the output module is configured to receive the second level signal received by the second level signal receiving end and control, in response to the signal of the first node, a signal outputted by the drive signal output end;
    or, the output module is configured to receive the first level signal of the first level signal receiving end and control, in response to a signal of the third node, a signal outputted by the drive signal output end;
    the first voltage stabilizing module is configured to receive the second level signal received by the second level signal receiving end and control a signal of the fourth node in response to the signal of the first node; and
    the second voltage stabilizing module is configured to receive the signal of the second node and control the signal of the third node in response to a second clock signal received by the second clock signal end, wherein the first level signal is a low-level signal and the second level signal is a high-level signal; when the signal outputted by the drive signal output end is a low-level signal, a potential of the signal of the third node is lower than a potential of the first level signal received by the first level signal receiving end; or, the second voltage stabilizing module is configured to receive the signal of the fourth node and control the signal of the third node, so that a potential of the signal of the third node is opposite to a potential of the signal of the first node.

2. The shift register according to claim 1, wherein the node control module comprises:
    a first control unit, electrically connected to the first level signal receiving end, the first node, and the second node; and
    a second control unit, electrically connected to the second level signal receiving end, the first node, and the second node, wherein
    the first control unit is configured to receive the first level signal of the first level signal receiving end and control the signal of the first node in response to the signal of the second node;
    or, the second control unit is configured to receive the second level signal received by the second level signal receiving end and control the signal of the first node in response to the signal of the second node.

3. The shift register according to claim 2, wherein the first control unit comprises at least one transistor having an active layer being an oxide semiconductor.

4. The shift register according to claim 3, wherein the first control unit comprises a second transistor; and
    a gate of the second transistor is electrically connected to the second node, a first pole of the second transistor is electrically connected to the first level signal receiving end, and a second pole of the second transistor is electrically connected to the first node.

5. The shift register according to claim 2, wherein the second control unit comprises a third transistor; and a gate of the third transistor is electrically connected to the second node, a first pole of the third transistor is electrically connected to the second level signal receiving end, and a second pole of the third transistor is electrically connected to the first node.

6. The shift register according to claim 1, wherein the shift register further comprises:
    a protection module, located between the second node and the third node, and between the second node and the second voltage stabilizing module, and electrically connected to the first level signal receiving end, wherein
    the protection module is configured to prevent the signal of the third node from being transmitted to the second node.

7. The shift register according to claim 6, wherein the protection module comprises a sixth transistor; and a gate of the sixth transistor is electrically connected to the first level signal receiving end, a first pole of the sixth transistor is electrically connected to the second node, and a second pole of the sixth transistor is electrically connected to the third node and the second voltage stabilizing module, separately.

8. The shift register according to claim 1, wherein the input module comprises a first transistor; and a gate of the first transistor is electrically connected to the first clock signal end, a first pole of the first transistor is electrically connected to the trigger signal input end, and a second pole of the first transistor is electrically connected to the second node.

9. The shift register according to claim 1, wherein the first voltage stabilizing module comprises a fourth transistor; and a gate of the fourth transistor is electrically connected to the first node, a first pole of the fourth transistor is electrically connected to the second level signal receiving end, and a second pole of the fourth transistor is electrically connected to the fourth node.

10. The shift register according to claim 1, wherein the second voltage stabilizing module comprises a fifth transistor and a first capacitor; and a gate of the fifth transistor is electrically connected to the third node, a first pole of the fifth transistor is electrically connected to the second clock signal end, a second pole of the fifth transistor is electrically connected to a second pole of the first capacitor and the fourth node, and a first pole of the first capacitor is electrically connected to the second node and the third node, separately.

11. The shift register according to claim 1, wherein the output module comprises a second capacitor, a seventh transistor, and an eighth transistor; and
both a gate of the seventh transistor and a first pole of the second capacitor are electrically connected to the first node, both a first pole of the seventh transistor and a second pole of the second capacitor are electrically connected to the second level signal receiving end, both a second pole of the seventh transistor and a second pole of the eighth transistor are electrically connected to the drive signal output end, a gate of the eighth transistor is electrically connected to the third node, and a first pole of the eighth transistor is electrically connected to the first level signal receiving end.

12. The shift register according to claim 1, wherein at least one of the input module, the first voltage stabilizing module, the second voltage stabilizing module, and the output module comprises at least one transistor having an active layer being silicon.

13. The shift register according to claim 12, wherein when the node control module comprises the transistor having an active layer being an oxide semiconductor, the transistor of the oxide semiconductor is an N-type transistor; and
when at least one of the input module, the first voltage stabilizing module, the second voltage stabilizing module, and the output module comprises at least one transistor having an active layer being silicon, the transistor having an active layer being silicon is a P-type transistor.

14. A gate drive circuit, comprising:
a plurality of cascaded shift registers, wherein each of the cascaded shift registers comprises:
a node control module, electrically connected to a first level signal receiving end, a second level signal receiving end, a first node, and a second node;
an input module, electrically connected to a first clock signal end, a trigger signal input end, and the second node;
an output module, electrically connected to the first level signal receiving end, the second level signal receiving end, the first node, a third node, and a drive signal output end;
a first voltage stabilizing module, electrically connected to the first node, a fourth node, and the second level signal receiving end;
a second voltage stabilizing module, electrically connected to the second node, the third node, the fourth node, and a second clock signal end, wherein
the input module is configured to receive an input signal of the trigger signal input end and control a signal of the second node in response to a first clock signal received by the first clock signal end;
the node control module is configured to receive a first level signal received by the first level signal receiving end and a second level signal received by the second level signal receiving end and control a signal of the first node in response to the signal of the second node;
the output module is configured to receive the second level signal received by the second level signal receiving end and control, in response to the signal of the first node, a signal outputted by the drive signal output end; or, the output module is configured to receive the first level signal of the first level signal receiving end and control, in response to a signal of the third node, a signal outputted by the drive signal output end;
the first voltage stabilizing module is configured to receive the second level signal received by the second level signal receiving end and control a signal of the fourth node in response to the signal of the first node; and
the second voltage stabilizing module is configured to receive the signal of the second node and control the signal of the third node in response to a second clock signal received by the second clock signal end, wherein the first level signal is a low-level signal and the second level signal is a high-level signal; when the signal outputted by the drive signal output end is a low-level signal, a potential of the signal of the third node is lower than a potential of the first level signal received by the first level signal receiving end; or, the second voltage stabilizing module is configured to receive the signal of the fourth node and control the signal of the third node, so that a potential of the signal of the third node is opposite to a potential of the signal of the first node.

15. The gate drive circuit according to claim 14, wherein the node control module comprises:
a first control unit, electrically connected to the first level signal receiving end, the first node, and the second node; and
a second control unit, electrically connected to the second level signal receiving end, the first node, and the second node, wherein
the first control unit is configured to receive the first level signal of the first level signal receiving end and control the signal of the first node in response to the signal of the second node; or, the second control unit is configured to receive the second level signal received by the second level signal receiving end and control the signal of the first node in response to the signal of the second node.

16. The gate drive circuit according to claim 15, wherein the first control unit comprises at least one transistor having an active layer being an oxide semiconductor.

17. The gate drive circuit according to claim 14, wherein the shift register further comprises:
- a protection module, located between the second node and the third node, and between the second node and the second voltage stabilizing module, and electrically connected to the first level signal receiving end, wherein
- the protection module is configured to prevent the signal of the third node from being transmitted to the second node.

18. A display panel, comprising:
- at least one gate drive circuit-according to claim 14, the gate drive circuit comprising:
- a plurality of cascaded shift registers, wherein each of the cascaded shift registers comprises:
- a node control module, electrically connected to a first level signal receiving end, a second level signal receiving end, a first node, and a second node;
- an input module, electrically connected to a first clock signal end, a trigger signal input end, and the second node;
- an output module, electrically connected to the first level signal receiving end, the second level signal receiving end, the first node, a third node, and a drive signal output end;
- a first voltage stabilizing module, electrically connected to the first node, a fourth node, and the second level signal receiving end;
- a second voltage stabilizing module, electrically connected to the second node, the third node, the fourth node, and a second clock signal end, wherein
- the input module is configured to receive an input signal of the trigger signal input end and control a signal of the second node in response to a first clock signal received by the first clock signal end;
- the node control module is configured to receive a first level signal received by the first level signal receiving end and a second level signal received by the second level signal receiving end and control a signal of the first node in response to the signal of the second node;
- the output module is configured to receive the second level signal received by the second level signal receiving end and control, in response to the signal of the first node, a signal outputted by the drive signal output end; or, the output module is configured to receive the first level signal of the first level signal receiving end and control, in response to a signal of the third node, a signal outputted by the drive signal output end;
- the first voltage stabilizing module is configured to receive the second level signal received by the second level signal receiving end and control a signal of the fourth node in response to the signal of the first node; and
- the second voltage stabilizing module is configured to receive the signal of the second node and control the signal of the third node in response to a second clock signal received by the second clock signal end, wherein the first level signal is a low-level signal and the second level signal is a high-level signal; when the signal outputted by the drive signal output end is a low-level signal, a potential of the signal of the third node is lower than a potential of the first level signal received by the first level signal receiving end; or, the second voltage stabilizing module is configured to receive the signal of the fourth node and control the signal of the third node, so that a potential of the signal of the third node is opposite to a potential of the signal of the first node.

19. The display panel according to claim 18, comprising at least two gate drive circuits, wherein one of the gate drive circuits is a light-emitting control drive circuit, and the other one of the gate drive circuits is a scan drive circuit; and
- a clock signal line electrically connected to the light-emitting control drive circuit is reused as a clock signal line of the scan drive circuit.

\* \* \* \* \*

UNITED STATES PATENT AND TRADEMARK OFFICE
CERTIFICATE OF CORRECTION

PATENT NO. : 12,100,356 B2
APPLICATION NO. : 18/269704
DATED : September 24, 2024
INVENTOR(S) : Linhong Han et al.

Page 1 of 1

It is certified that error appears in the above-identified patent and that said Letters Patent is hereby corrected as shown below:

In the Claims

Claim 18, Column 25, Line 12, delete "drive circuit-according to claim 14," and insert
--drive circuit,--.

Signed and Sealed this
Sixth Day of May, 2025

Coke Morgan Stewart
*Acting Director of the United States Patent and Trademark Office*